US011955776B2

(12) United States Patent
Sandanayaka et al.

(10) Patent No.: US 11,955,776 B2
(45) Date of Patent: *Apr. 9, 2024

(54) CURRENT-INJECTION ORGANIC SEMICONDUCTOR LASER DIODE, METHOD FOR PRODUCING SAME AND PROGRAM

(71) Applicants: KYUSHU UNIVERSITY, NATIONAL UNIVERSITY CORPORATION, Fukuoka (JP); KOALA TECH INC., Fukuoka (JP)

(72) Inventors: Sangarange Don Atula Sandanayaka, Fukuoka (JP); Fatima Bencheikh, Fukuoka (JP); Kenichi Goushi, Fukuoka (JP); Jean-Charles Ribierre, Fukuoka (JP); Chihaya Adachi, Fukuoka (JP); Takashi Fujihara, Fukuoka (JP); Toshinori Matsushima, Fukuoka (JP)

(73) Assignees: KYUSHU UNIVERSITY, NATIONAL UNIVERSITY CORPORATION, Fukuoka (JP); KOALA Tech Inc., Fukuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/170,106

(22) Filed: Feb. 16, 2023

(65) Prior Publication Data

US 2023/0198230 A1 Jun. 22, 2023

Related U.S. Application Data

(62) Division of application No. 17/505,204, filed on Oct. 19, 2021, now Pat. No. 11,626,710, which is a
(Continued)

(30) Foreign Application Priority Data

Feb. 7, 2017 (JP) ................. 2017-020797

(51) Int. Cl.
*H01S 5/36* (2006.01)
*H01S 5/026* (2006.01)
(Continued)

(52) U.S. Cl.
CPC ............... *H01S 5/36* (2013.01); *H01S 5/026* (2013.01); *H01S 5/04253* (2019.08); *H01S 5/1206* (2013.01)

(58) Field of Classification Search
CPC ........ H01S 5/36; H01S 5/026; H01S 5/04253; H01S 5/1206; H01S 5/1215; H01S 5/1228; H01S 5/187
See application file for complete search history.

(56) References Cited

U.S. PATENT DOCUMENTS

| 4,023,993 A | 5/1977 | Scifres et al. |
| 5,881,089 A | 3/1999 | Berggren et al. |

(Continued)

FOREIGN PATENT DOCUMENTS

| CN | 101388523 A | 3/2009 |
| CN | 201927885 A | 8/2011 |

(Continued)

OTHER PUBLICATIONS

Office Action dated Jun. 29, 2023 issued in the corresponding Taiwanese patent application No. 112103527 with its English Translation.
(Continued)

*Primary Examiner* — Yuanda Zhang
(74) *Attorney, Agent, or Firm* — BROWDY AND NEIMARK, PLLC

(57) ABSTRACT

Disclosed is a current-injection organic semiconductor laser diode comprising a pair of electrodes, an optical resonator structure, and one or more organic layers including a light amplification layer composed of an organic semiconductor,
(Continued)

which has a sufficient overlap between the distribution of exciton density and the electric field intensity distribution of the resonant optical mode during current injection to emit laser light.

19 Claims, 11 Drawing Sheets

Related U.S. Application Data division of application No. 16/338,123, filed as application No. PCT/JP2018/005362 on Feb. 7, 2018, now Pat. No. 11,183,815.

(51) Int. Cl.
  *H01S 5/042* (2006.01)
  *H01S 5/12* (2021.01)

(56) References Cited

U.S. PATENT DOCUMENTS

| | | | |
|---|---|---|---|
| 6,111,906 A | 8/2000 | Muroya | |
| 6,259,717 B1 | 7/2001 | Stone et al. | |
| 6,704,335 B1 | 3/2004 | Koyama et al. | |
| 7,965,037 B2 | 6/2011 | Yokoyama et al. | |
| 11,183,815 B2 | 11/2021 | Sandanayaka et al. | |
| 11,626,710 B2 * | 4/2023 | Sandanayaka | H01S 5/026 |
| | | | 372/50.11 |
| 2003/0209972 A1 | 11/2003 | Holmes et al. | |
| 2003/0235229 A1 | 12/2003 | Deng et al. | |
| 2004/0247008 A1 | 12/2004 | Scheuer et al. | |
| 2005/0047458 A1 | 3/2005 | Nomura et al. | |
| 2006/0013343 A1 | 1/2006 | El-Gamal et al. | |
| 2006/0133437 A1 | 6/2006 | Forrest et al. | |
| 2007/0104242 A1 | 5/2007 | Kudo et al. | |
| 2008/0006820 A1 | 1/2008 | Schols et al. | |
| 2008/0187017 A1 | 8/2008 | Linder et al. | |
| 2009/0058274 A1 | 3/2009 | Yokoyama | |
| 2009/0135874 A1 | 5/2009 | Liu | |
| 2009/0323747 A1 | 12/2009 | Nakanotani et al. | |
| 2010/0054291 A1 | 3/2010 | Yukawa et al. | |
| 2011/0229073 A1 | 9/2011 | Sininghaus et al. | |
| 2013/0114628 A1 | 5/2013 | Caneau et al. | |
| 2014/0126602 A1 | 5/2014 | Shapira et al. | |
| 2014/0321485 A1 | 10/2014 | Seidel et al. | |
| 2015/0280142 A1 | 10/2015 | Arai et al. | |
| 2016/0141838 A1 | 5/2016 | Gillin et al. | |

FOREIGN PATENT DOCUMENTS

| | | | |
|---|---|---|---|
| CN | 102916340 A | 2/2013 | |
| CN | 104659651 A | 5/2015 | |
| CN | 104684917 A | 6/2015 | |
| EP | 0706243 A2 | 4/1996 | |
| EP | 0878883 A1 | 11/1998 | |
| JP | 10-256653 A | 9/1998 | |
| JP | 10-321941 A | 12/1998 | |
| JP | 11-195838 A | 7/1999 | |
| JP | 2002-217489 A | 8/2002 | |
| JP | 2002-329913 A | 11/2002 | |
| JP | 2004-186599 A | 7/2004 | |
| JP | 2004-214276 A | 7/2004 | |
| JP | 2005-039236 A | 2/2005 | |
| JP | 2005-041178 A1 | 2/2005 | |
| JP | 2005-85942 A | 3/2005 | |
| JP | 2009-48837 | 8/2007 | |
| JP | 2007-329142 A | 12/2007 | |
| JP | 4-100287 B2 | 3/2008 | |
| JP | 2008-524870 A | 7/2008 | |
| JP | 2008-251683 A | 10/2008 | |
| JP | 2010-80948 A | 4/2010 | |
| JP | 2010-529669 A | 8/2010 | |
| JP | 2013-518429 A | 5/2013 | |
| JP | 2015-149403 A | 8/2015 | |
| TW | 200509484 A | 3/2005 | |
| TW | 200509487 A | 3/2005 | |
| TW | 201315562 A | 4/2013 | |
| TW | 201328091 A | 7/2013 | |
| WO | 2005/053124 A1 | 6/2005 | |
| WO | 2006/068883 A1 | 6/2006 | |
| WO | 2006/136346 A1 | 12/2006 | |
| WO | 2007/029718 A1 | 3/2007 | |
| WO | 2008-149276 A1 | 12/2008 | |
| WO | 2011/093883 A1 | 8/2011 | |
| WO | 2012/115218 A1 | 8/2012 | |

OTHER PUBLICATIONS

Office Action dated May 25, 2023 issued in the corresponding EP patent application No. 18751087.0.

International Preliminary Report on Patentability for PCT International Application No. PCT/JP2017/033366, dated Jul. 11, 2017.

International Search Report and Search Opinion for corresponding PCT International Application No. PCT/JP2018/005362, dated Apr. 10, 2018.

International Search Report and Search Opinion for PCT International Application No. PCT/PCT/JP2017/033366, dated Nov. 7, 2017.

Kuehne et al., Organic Lasers: Recent Developments on Materials, Device Geometries, and Fabrication Techniques, Chem. Rev. 116, 12823-12864 (2016).

Hayashi et al., Suppression of roll-off characteristics of organic light-emitting diodes by narrowing current injection/transport area to 50 nmAppl. Phys. Lett. 106, 093301 (2015).

Sandanayaka et al., Quasi-Continuous-Wave Organic Thin-Film Distributed Feedback Laser, Adv. Opt. Mater. 4, 834- 839 (2016).

Sandanayaka et al., Toward continuous-wave operation of organic semiconductor lasers, Science Adv. 3, e1602570 (2017).

Murawski et al., Efficiency Roll-Off in Organic Light-Emitting Diodes, Adv. Mater. 25, 6801-6827 (2013).

C. Karnutsch et al. ("Improved organic semiconductor lasers based on a mixed-order distributed feedback resonator design," Appl. Phys. Lett. 90, 131104, 2007) (Year: 2007).

Chinese office action, with translation, dated May 8, 2020 for corresponding Chinese patent application No. 201880003730.3.

Office action dated Jul. 7, 2020, from corresponding U.S. Appl. No. 16/328,894.

Office Action dated Nov. 2, 2020, from corresponding U.S. Appl. No. 16/328,894.

Office Action dated Feb. 19, 2021 issued in the related U.S. Appl. No. 16/328,894.

Office Action dated Jan. 12, 2021 issued in the corresponding Chinese patent application No. 201880003730.3 with its English Translation.

Japanese office action dated Jul. 13, 2021 from Japanese patent application No. 2019-512009.

Office Action dated Aug. 16, 2021 issued in the related Taiwanese patent application No. 106130060 with its English Translation.

Office Action dated Aug. 17, 2021 issued in the corresponding Chinese patent application No. 201880003730.3 with its English Translation.

Office Action dated Aug. 31, 2021 issued in the corresponding Japanese patent application No. 2019-515680 and its English Machine Translation.

Office Action dated Sep. 13, 2021 issued in the related Korean patent application No. 10-2017-0027963 with its English Machine Translation.

European Search Report dated Dec. 16, 2020 from corresponding European patent application No. 18751087.0.

Korean Office Action dated Jan. 12, 2021, from corresponding Korean application No. 10-2017-0027963.

Korean Office action dated Dec. 20, 2021, from corresponding Korean Patent Application No. 10-2019-7009287.

Office Action dated Jan. 29, 2022 issued in the related Chinese patent application No. 201880003730.3 with its English Machine Translation.

(56) References Cited

OTHER PUBLICATIONS

Mohammad Reza Shayesteh et al., "Design and simulation of a high contrast grating organic VCSEL under electrical pumping", Organic Electronics 35 (2016) 47-52.
Daniel Schneider et al., "Laser threshold analysis of first and second order organic solidstate distributed feedback laser", Organic Light-emitting Materials and Devices VII, Proceedings of SPIE vol. 5214 (2004).
Office Action dated Feb. 22, 2022 issued in the related Japanese patent application No. 2019-515680 with its English Machine Translation.
Taiwan Office Action dated May 5, 2022, from corresponding Taiwanese patent application No. 107104331.
Office Action dated Sep. 7, 2022 issued in the corresponding Taiwanese patent application No. 107104331 with its English Translation.
Office Action dated Feb. 7, 2023 issued in the related Japanese patent application No. 2022-065891 with its English Machine Translation.
Ichikawa et al., Recent progresses and problems in research and development on organic semiconductor lasers, Laser research, p. 570-575 (Sep. 15, 2004).
Office Action dated Nov. 13, 2023 issued in the corresponding Taiwanese patent application 112108548 with its English Machine Translation.

\* cited by examiner

[Fig. 1]
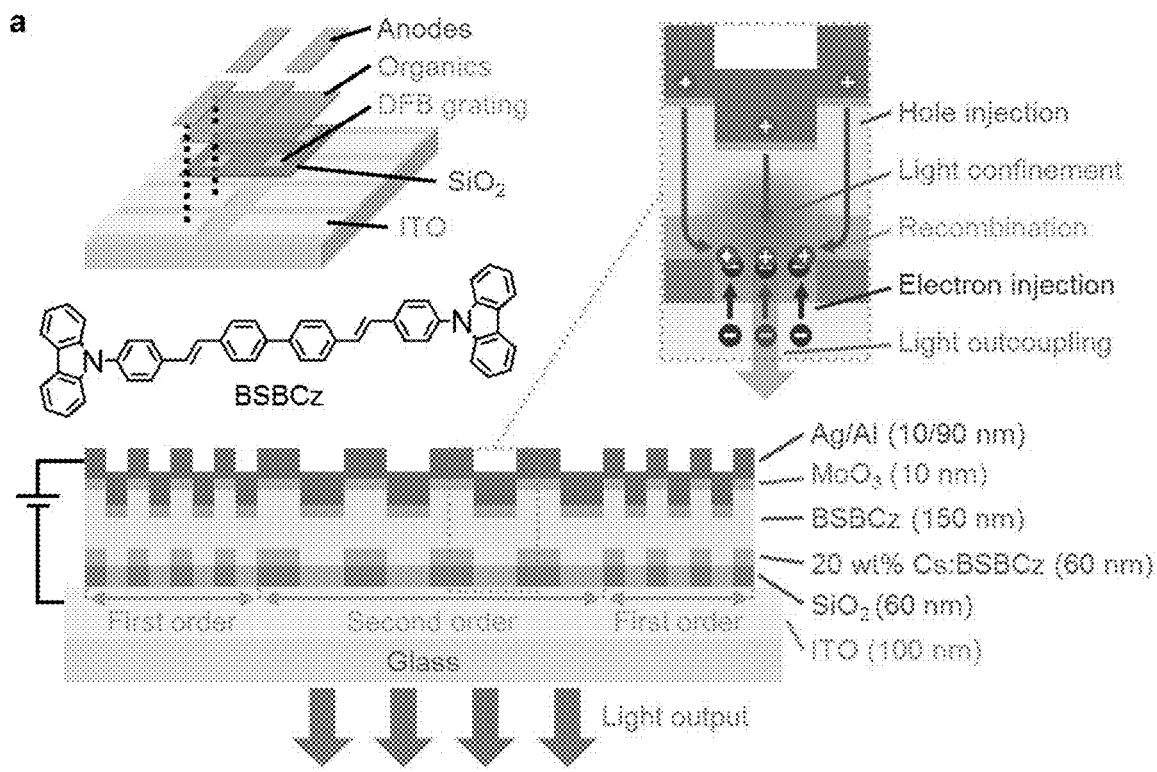
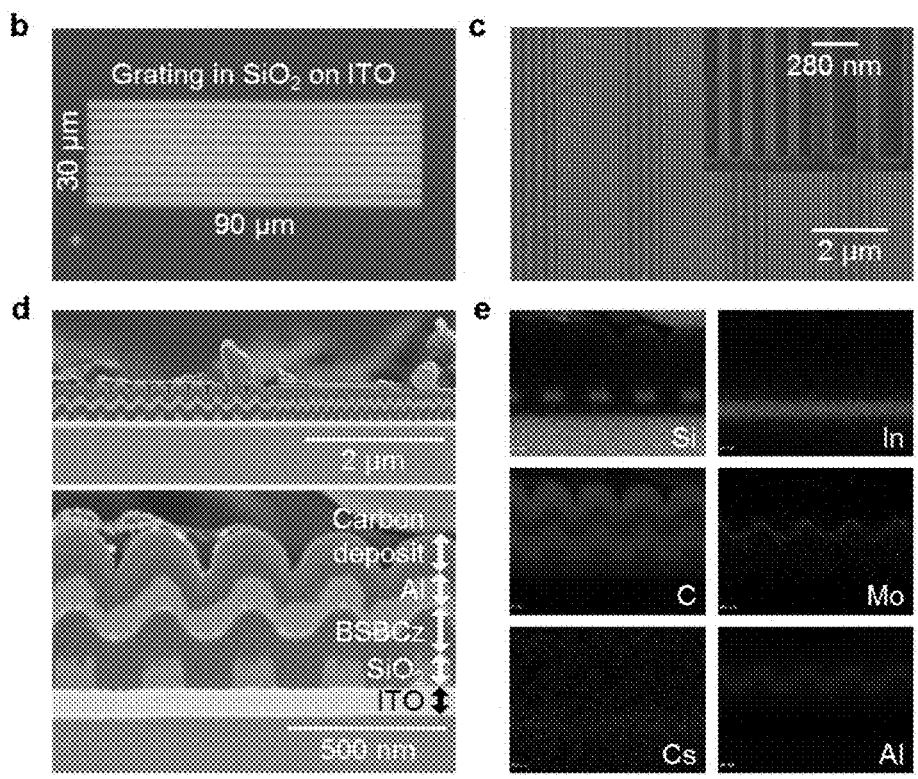

[Fig. 2]
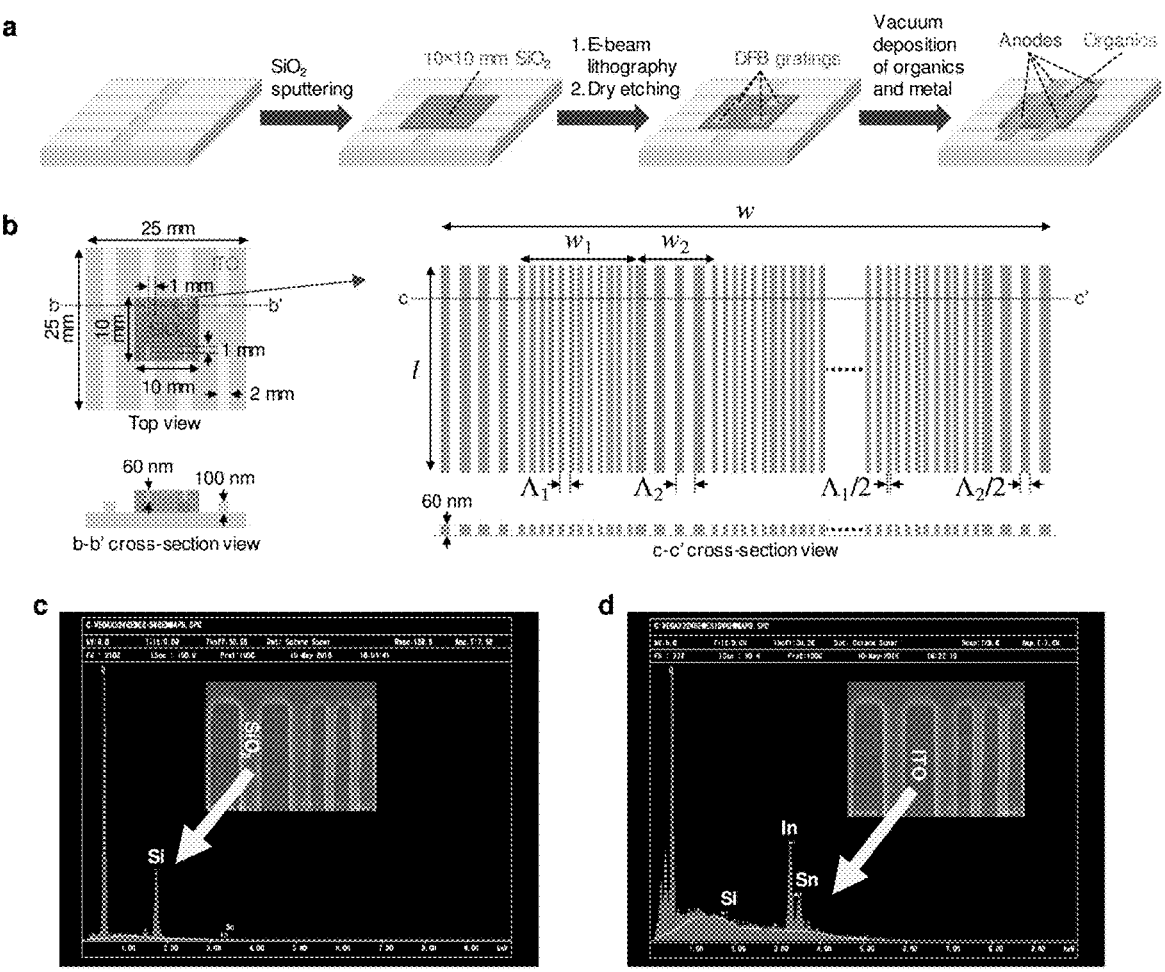

[Fig. 3]
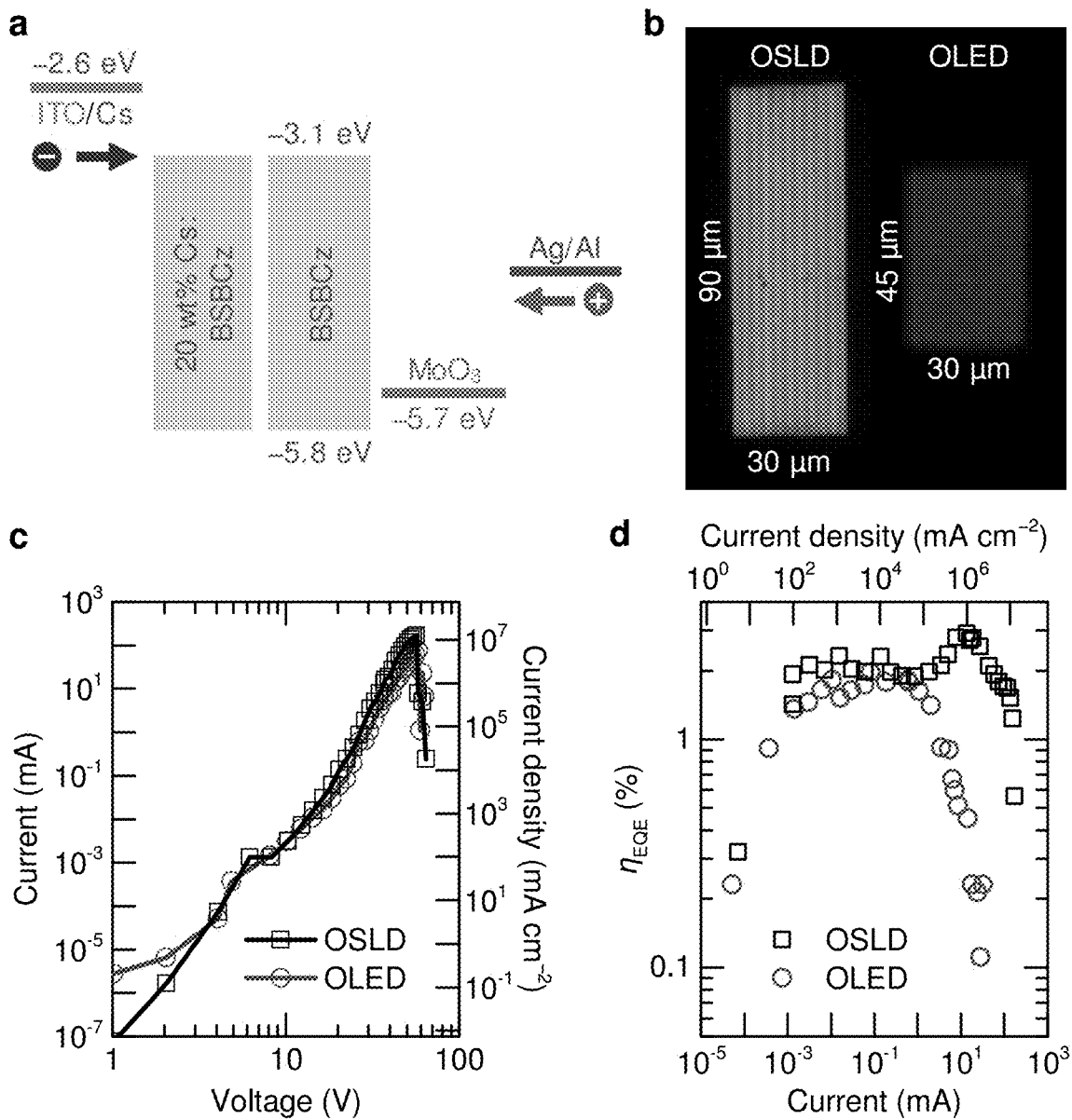

[Fig. 4]
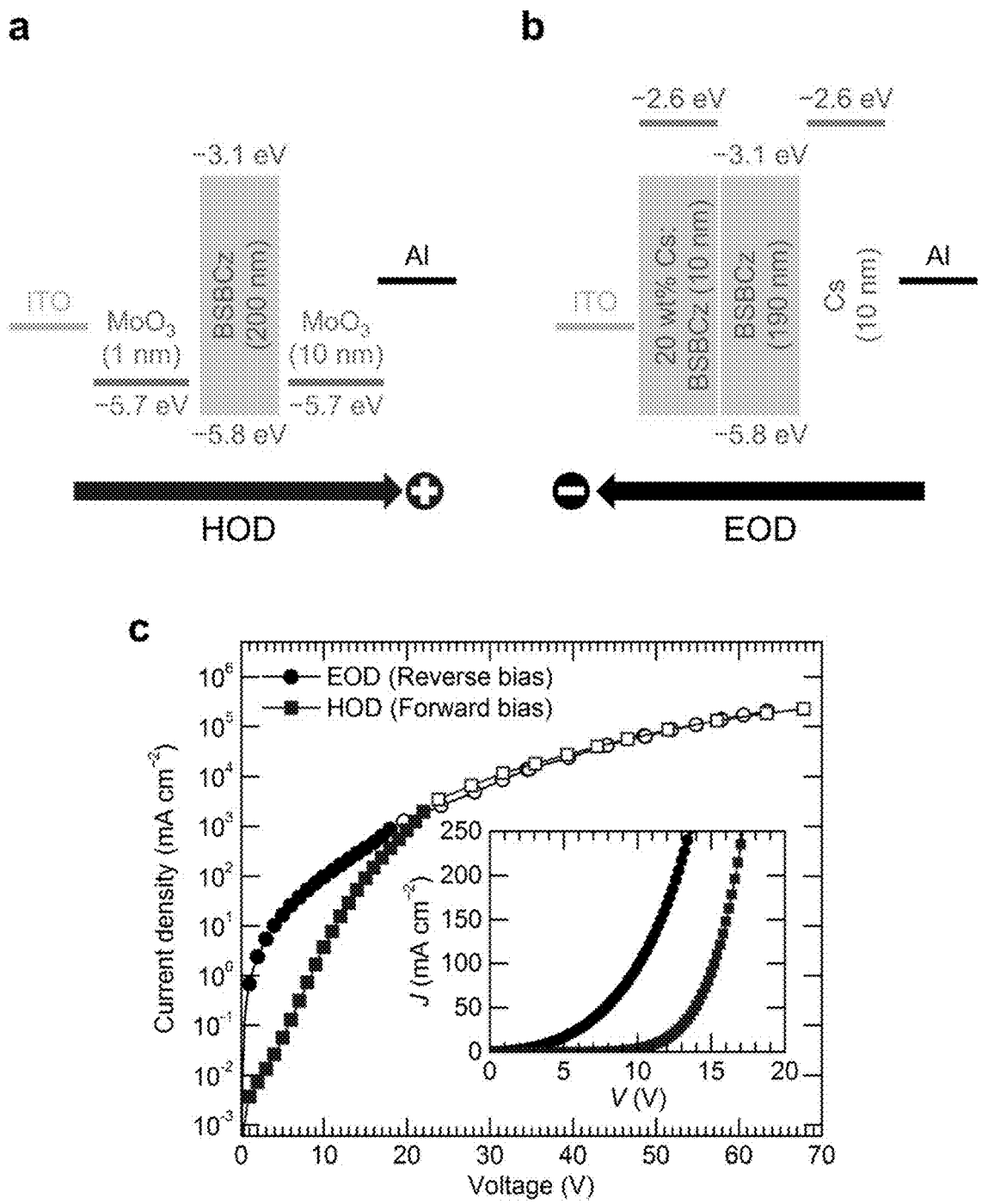

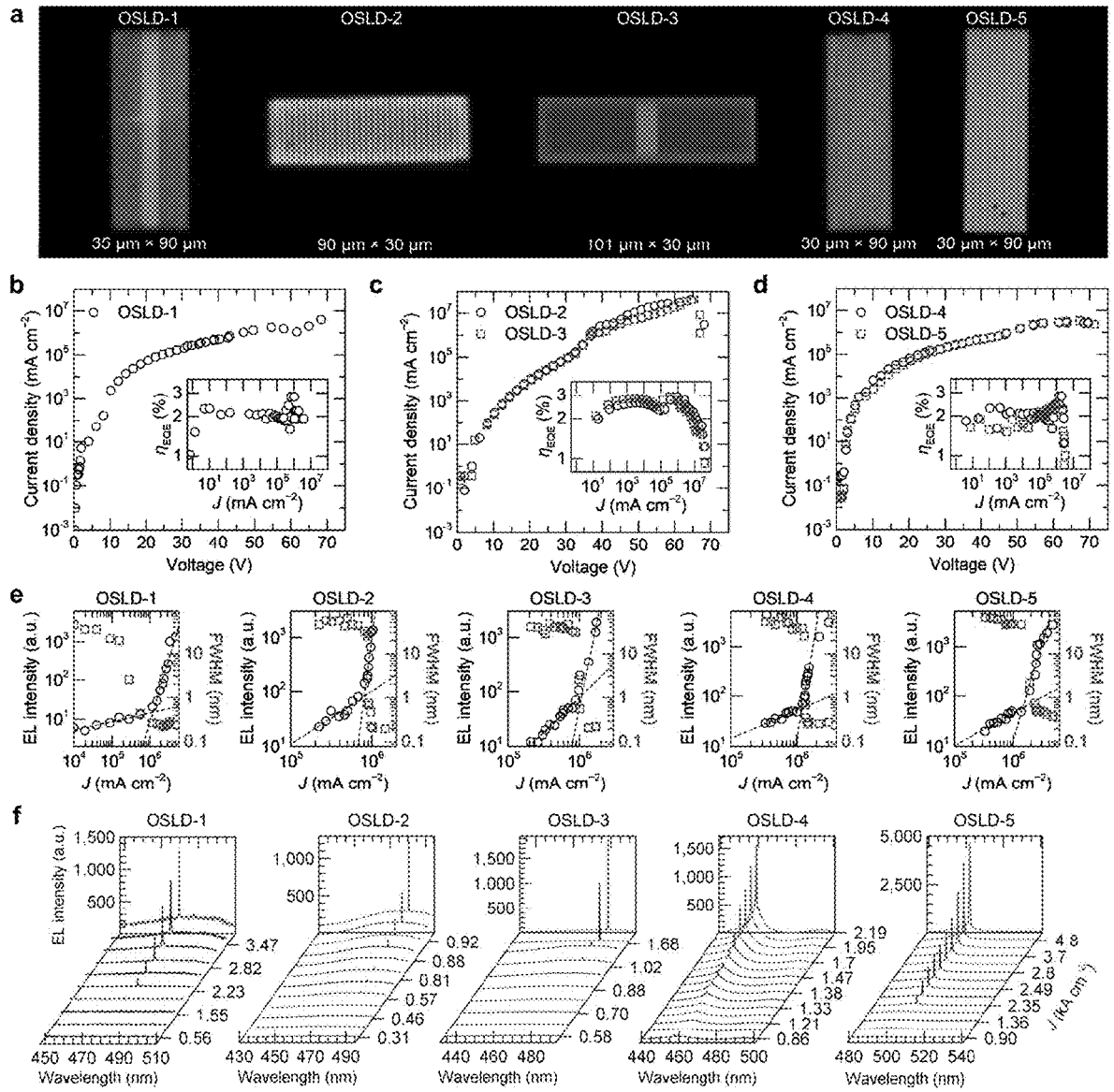
[Fig. 5]

[Fig. 6]
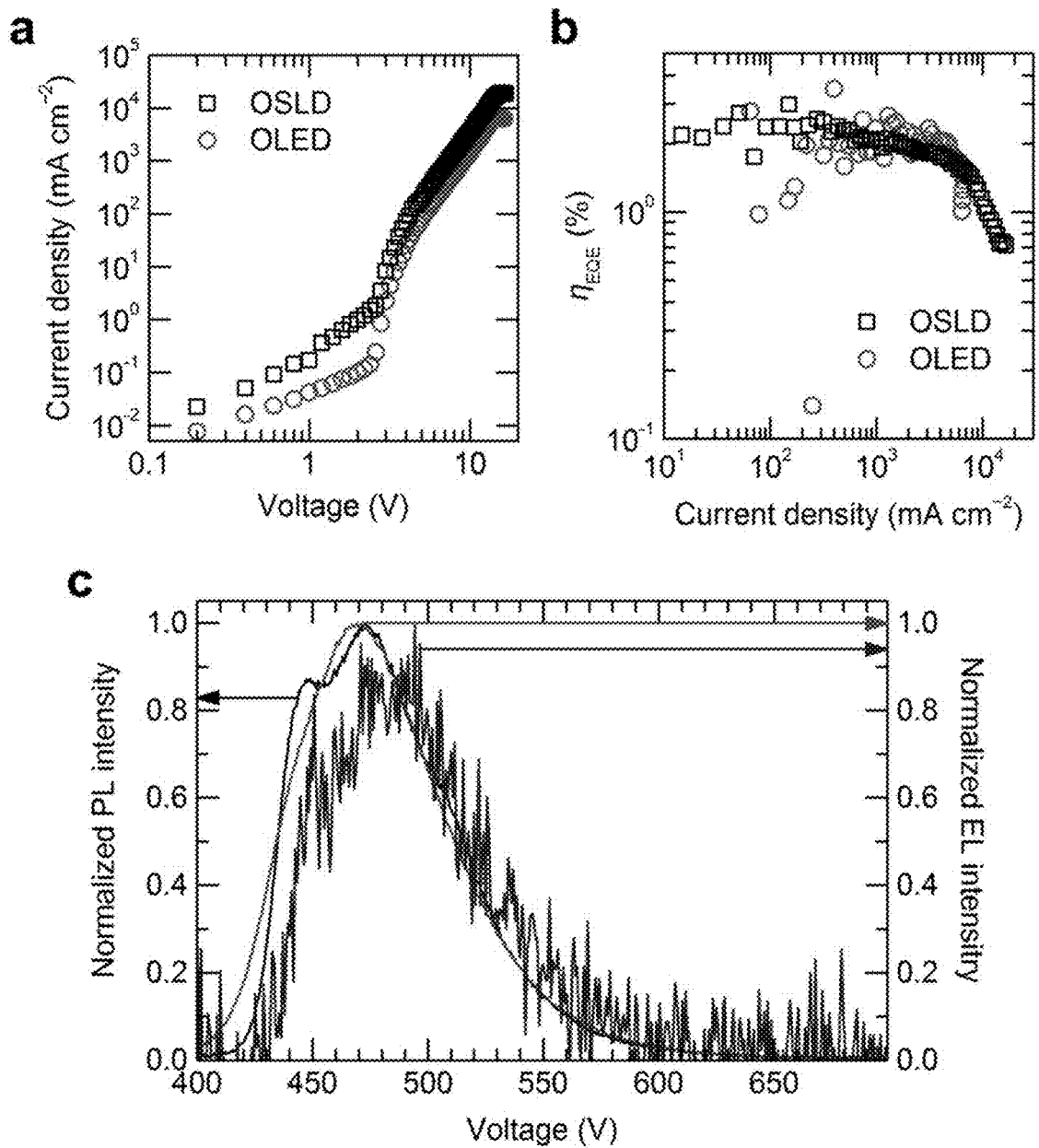

[Fig. 7]
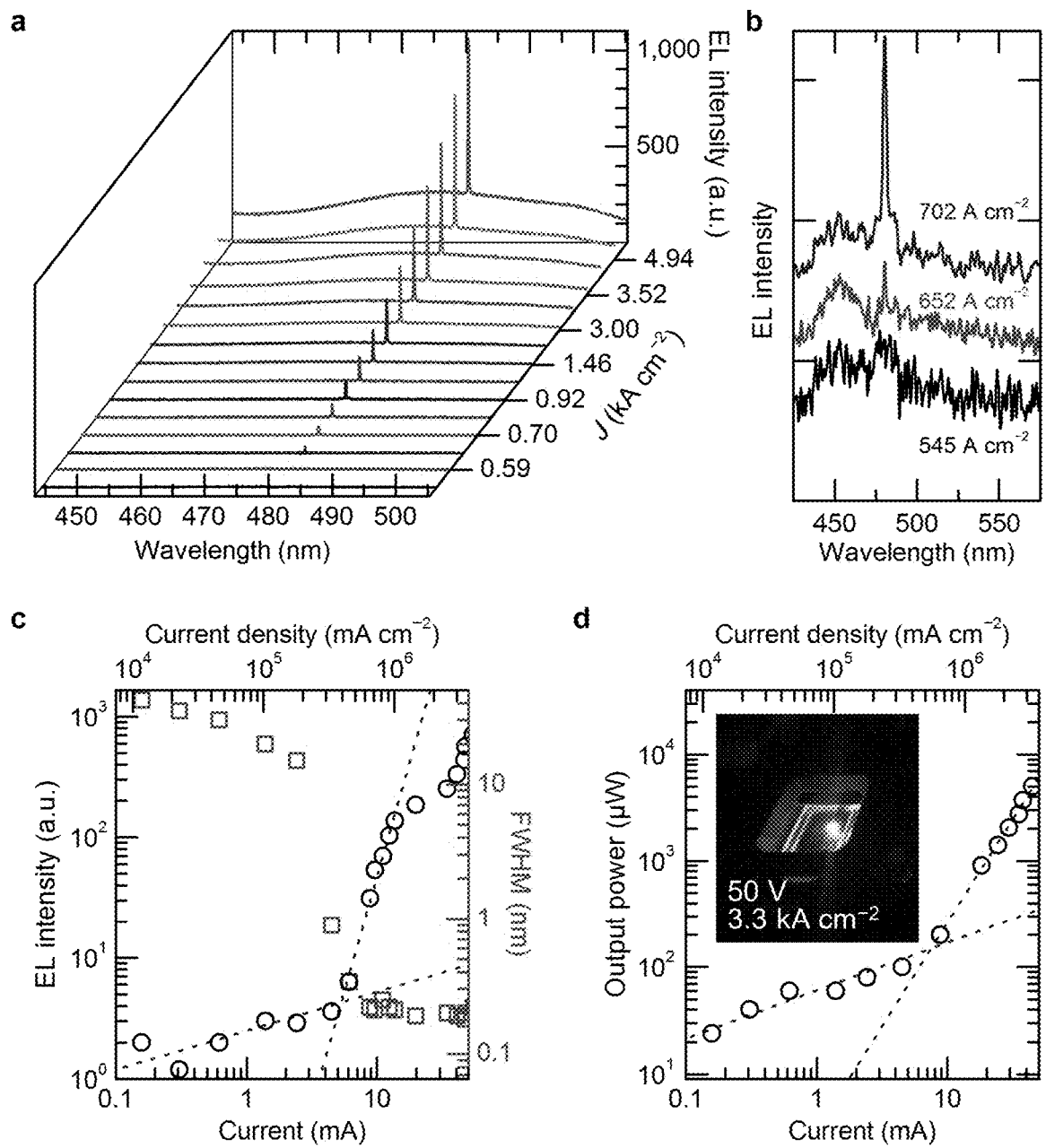

[Fig. 8]
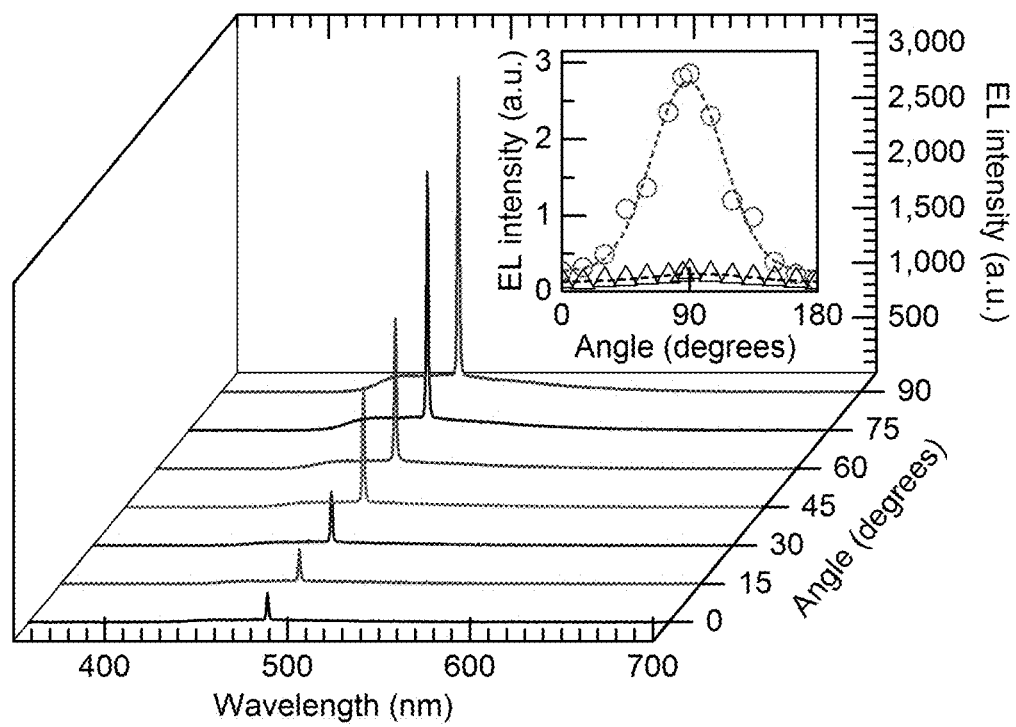
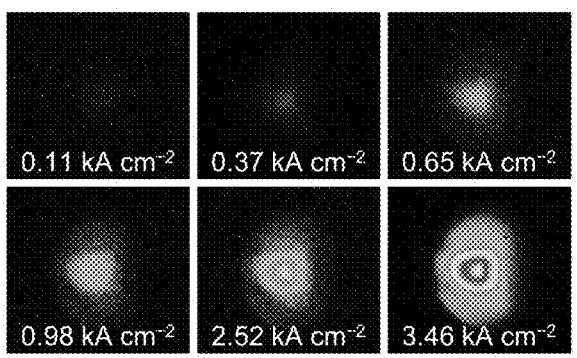
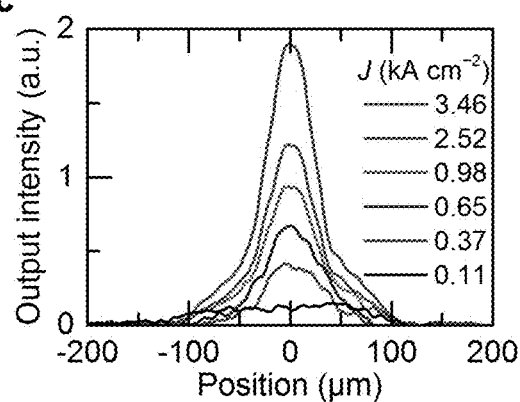
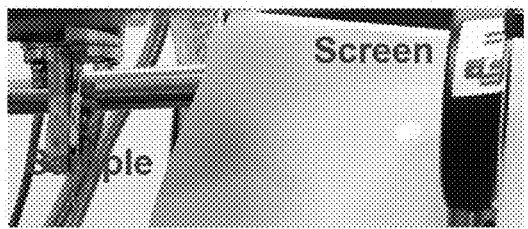
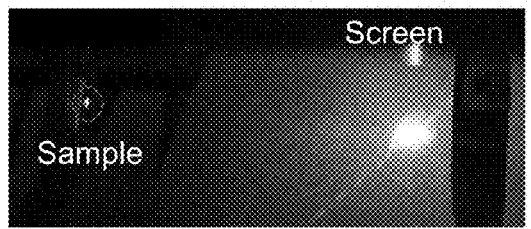

[Fig. 9]
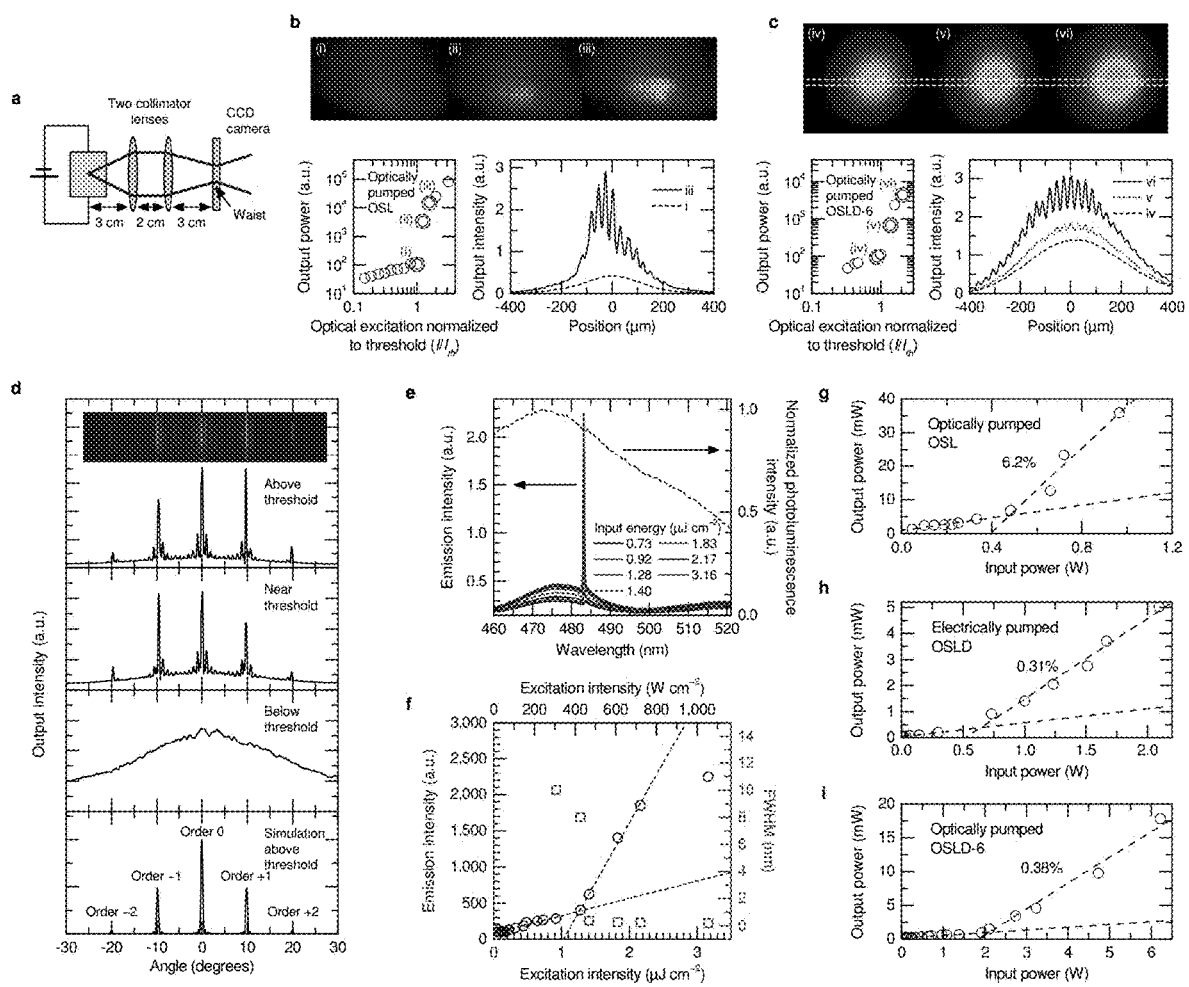

[Fig. 10]
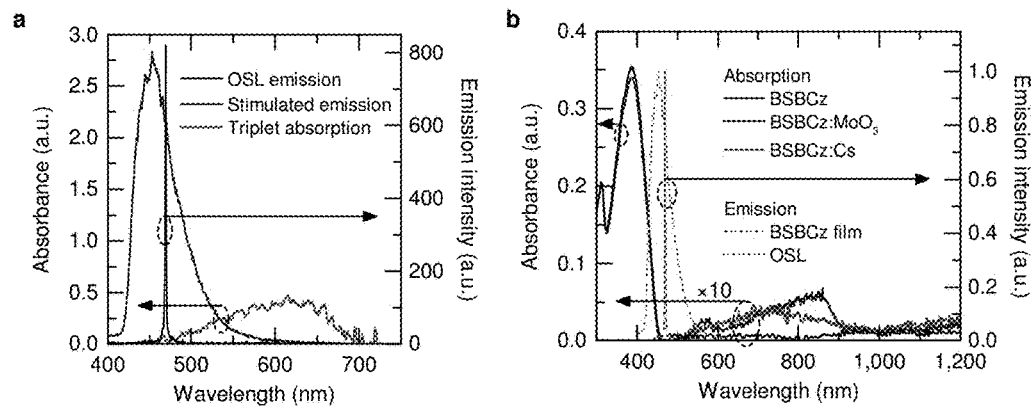
[Fig. 11]
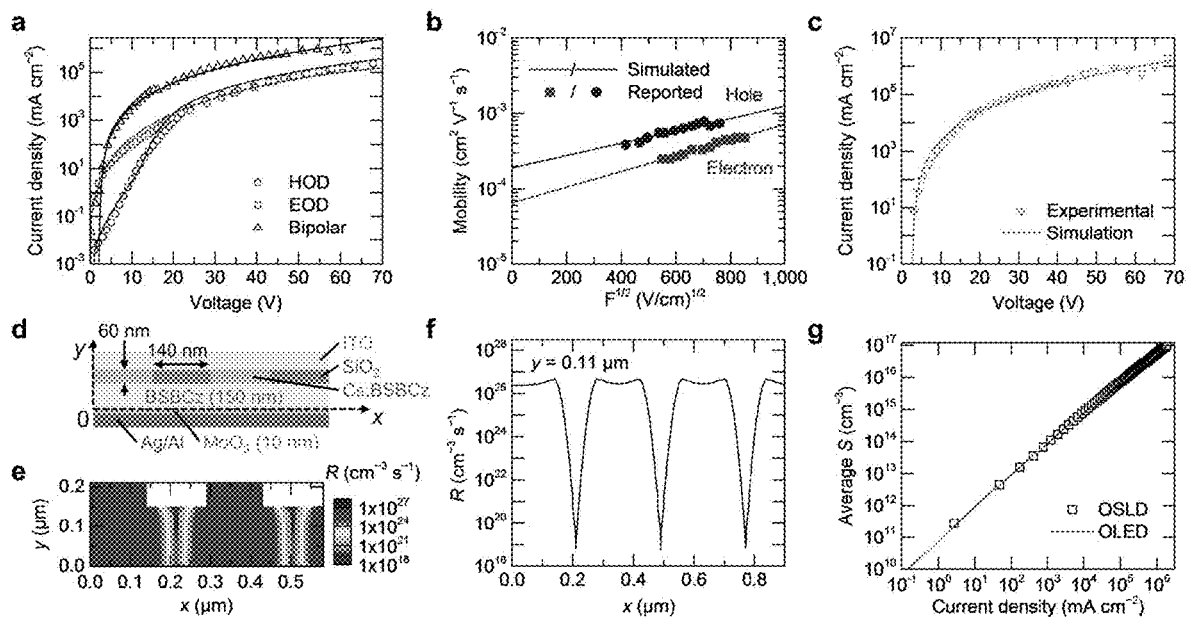

[Fig. 12]
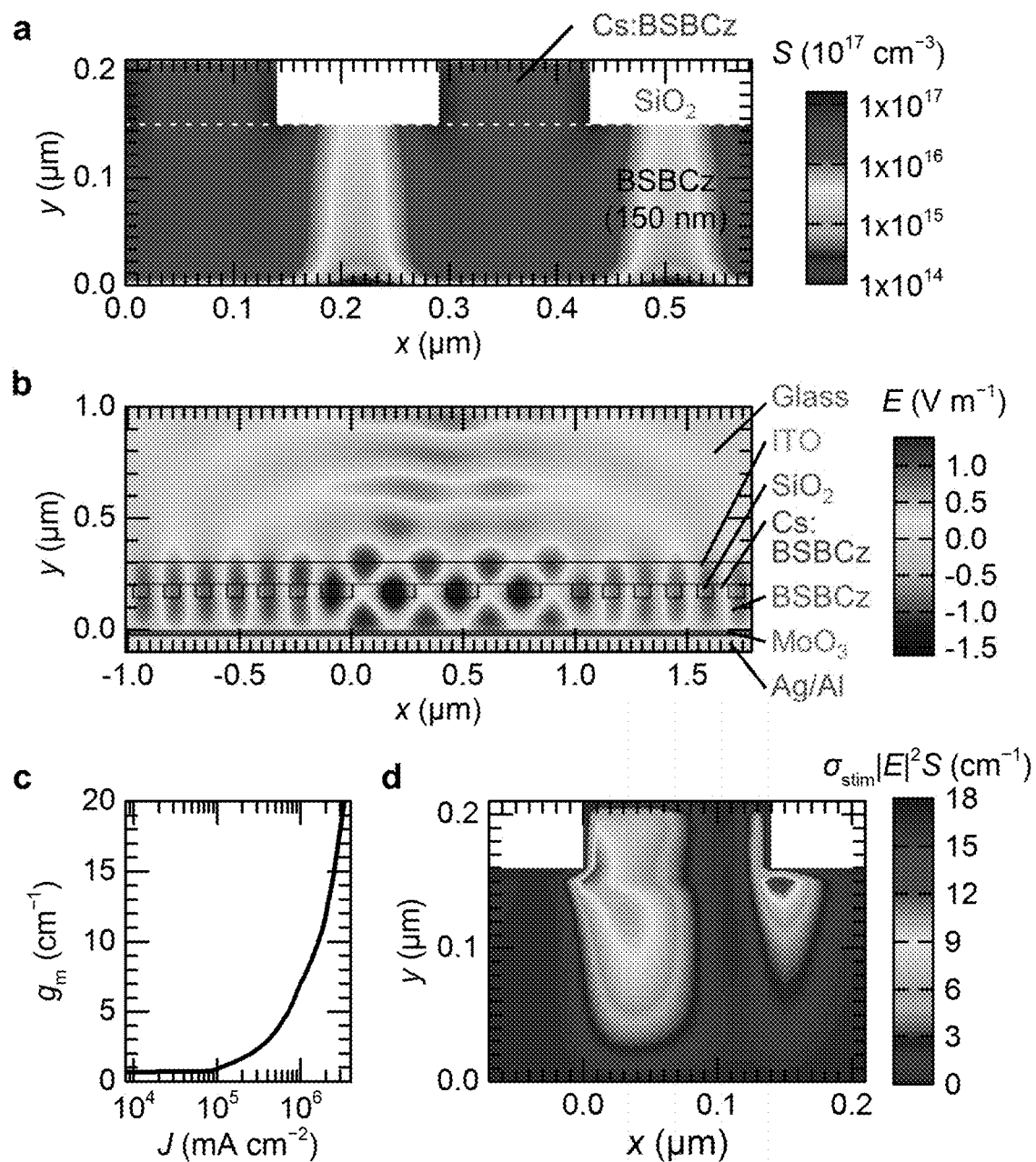

CURRENT-INJECTION ORGANIC SEMICONDUCTOR LASER DIODE, METHOD FOR PRODUCING SAME AND PROGRAM

TECHNICAL FIELD

The present invention relates to a current-injection organic semiconductor laser diode and a method for producing it. The present invention also relates to a program for designing a current-injection organic semiconductor laser diode.

BACKGROUND ART

The properties of optically pumped organic semiconductor lasers (OSLs) have dramatically improved in the last two decades as a result of major advances in both the development of high-gain organic semiconductor materials and the design of high-quality-factor resonator structures[1-5]. The advantages of organic semiconductors as gain media for lasers include their high photoluminescence (PL) quantum yields, large stimulated emission cross sections, and broad emission spectra across the visible region along with their chemical tunability and ease of processing. Owing to recent advances in low-threshold distributed feedback (DFB) OSLs, optical pumping by electrically driven nanosecond-pulsed inorganic light-emitting diodes was demonstrated, providing a route toward a new compact and low-cost visible laser technology[6]. However, the ultimate goal is electrically driven organic semiconductor laser diodes (OSLDs). In addition to enabling the full integration of organic photonic and optoelectronic circuits, the realization of OSLDs will open novel applications in spectroscopy, displays, medical devices (such as retina displays, sensors, and photodynamic therapy devices), and LIFI telecommunications.

The problems that have prevented the realization of lasing by the direct electrical pumping of organic semiconductors are mainly due to the optical losses from the electrical contacts and the triplet and polaron losses taking place at high current densities[4,5,7-9]. Approaches that have been proposed to solve these fundamental loss issues include the use of triplet quenchers[10-12] to suppress triplet absorption losses and singlet quenching by singlet-triplet exciton annihilation as well as the reduction of the device active area[13] to spatially separate where exciton formation and exciton radiative decay occur and minimize the polaron quenching processes. However, even with the advances that have been made in organic light-emitting diodes (OLEDs) and optically pumped organic semiconducting DFB lasers[5], a current-injection OSLD has still not been conclusively demonstrated.

Patent Literature 1[P1] describes realization of current-injection OSLD. According to the literature, the device is produced by forming a 500 nm-pitch grating (resonator) on an ITO film, then forming a 250 nm-thick hole transport layer of N,N'-diphenyl-N,N'-bis(3-methylphenyl)-1,1'-biphenyl-4,4'-diamine (TPD) by vapor deposition, further forming a 100 nm-thick light emitting layer by spin coating with a dichloromethane solution of an aromatic polycarbonate resin, forming a 250 nm-thick electron transport layer of 2-(4-tert-butylphenyl)-5-(4-biphenylyl)-1,3,4-oxadiazole by vapor deposition, and forming a 200 mm-thick MgAg alloy layer. This literature describes laser emission by voltage application of 30 V to this device. However, in fact, when a dichloromethane solution of a polycarbonate is applied onto the TPD layer by spin coating, the TPD layer dissolves and, naturally, therefore the device could not be reproduced. In addition, this device has an organic hole transport layer and an organic electron transport layer each having a thickness of 250 nm formed in addition to the 100 nm-thick organic light emitting layer therein, and therefore the total thickness of the organic layers therein is considerably large. It is impossible to attain laser oscillation by application of a direct current of 30 V to a device having a large total thickness of organic layers therein.

Other patent literatures[P2,P3] describe a possibility of realizing current-injection OSLDs. However, these patent literatures merely make general description relating to current-injection OSLDs, not showing at all any specific current-injection OSLD that has confirmed laser oscillation.

Patent Literatures

Patent Literature 1: JP-A-2004-186599
Patent Literature 2: JP-A-H10-321941
Patent Literature 3: JP-A-2008-524870

Non-Patent Literatures

Non-Patent Literature 1: Tessler, N., Denton, G. J. & Friend, R. H. Lasing from conjugated-polymer microcavities. *Nature* 382, 695-697 (1996).
Non-Patent Literature 2: Kozlov, V. G., Bulović, V., Burrows, P. E. & Forrest, S. R. Laser action in organic semiconductor waveguide and double-heterostructure devices. *Nature* 389, 362-364 (1997).
Non-Patent Literature 3: Hide, F. et al. Semiconducting polymers: A new class of solid-state laser materials. *Science* 273, 1833 (1996).
Non-Patent Literature 4: Samuel, I. D. W. & Turnbull, G. A. Organic semiconductor lasers. *Chem. Rev.* 107, 1272-1295 (2007).
Non-Patent Literature 5: Kuehne, A. J. C. & Gather M. C. Organic lasers: Recent developments on materials, device geometries and fabrication techniques. *Chem. Rev.* 116, 12823-12864 (2016).
Non-Patent Literature 6: Tsiminis, G. et al. Nanoimprinted organic semiconductor lasers pumped by a light-emitting diode. *Adv. Mater.* 25, 2826-2830 (2013).
Non-Patent Literature 7: Baldo, M. A., Holmes, R. J. & Forrest, S. R. Prospects for electrically pumped organic lasers. *Phys. Rev. B* 66, 035321 (2002).
Non-Patent Literature 8: Bisri, S. Z., Takenobu, T. & Iwasa, Y. The pursuit of electrically-driven organic semiconductor lasers. *J. Mater. Chem. C* 2, 2827-2836 (2014).
Non-Patent Literature 9: Samuel, I. D. W., Namdas, E. B. & Turnbull, G. A. How to recognize lasing. *Nature Photon.* 3, 546-549 (2009).
Non-Patent Literature 10: Sandanayaka, A. S. D. et al. Improvement of the quasi-continuous-wave lasing properties in organic semiconductor lasers using oxygen as triplet quencher. *Appl. Phys. Lett.* 108, 223301 (2016).
Non-Patent Literature 11: Zhang, Y. F. & Forrest, S. R. Existence of continuous-wave threshold for organic semiconductor lasers. *Phys. Rev. B* 84, 241301 (2011).
Non-Patent Literature 12: Schols, S. et al. Triplet excitation scavenging in films of conjugated polymers. *Chem. Phys. Chem.* 10, 1071-1076 (2009).
Non-Patent Literature 13: Hayashi, K. et al. Suppression of roll-off characteristics of organic light-emitting diodes by narrowing current injection/transport area to 50 nm. *Appl. Phys. Lett.* 106, 093301 (2015).

Non-Patent Literature 14: Gartner, C. et al. The influence of annihilation processes on the threshold current density of organic laser diodes. *J. Appl. Phys.* 101, 023107 (2007).

Non-Patent Literature 15: Sandanayaka, A. S. D. et al. Quasi-continuous-wave organic thin film distributed feedback laser. *Adv. Opt. Mater.* 4, 834-839 (2016).

Non-Patent Literature 16: Aimono, T. et al. 100% fluorescence efficiency of 4,4'-bis[(N-carbazole)styryl]biphenyl in a solid film and the very low amplified spontaneous emission threshold. *Appl. Phys. Lett.* 86, 71110 (2005).

Non-Patent Literature 17: Sandanayaka, A. S. D. et al. Toward continuous-wave operation of organic semiconductor lasers. *Science Adv.* 3, e1602570 (2017).

Non-Patent Literature 18: Karnutsch, C. et al. Improved organic semiconductor lasers based on a mixed-order distributed feedback resonator design. *Appl. Phys. Lett.* 90, 131104 (2007).

Non-Patent Literature 19: Chénais, S. & Forget, S. Recent advances in solid-state organic lasers. *Polym. Int.* 61, 390-406 (2012).

Non-Patent Literature 20: Yokoyama, D. et al. Spectrally narrow emissions at cutoff wavelength from edges of optically and electrically pumped anisotropic organic films. *J. Appl. Phys.* 103, 123104 (2008).

Non-Patent Literature 21: Yamamoto, H. et al. Amplified spontaneous emission under optical pumping from an organic semiconductor laser structure equipped with transparent carrier injection electrodes. *Appl. Phys. Lett.* 84, 1401-1403 (2004).

Non-Patent Literature 22: Wallikewitz, B. H. et al. Lasing organic light-emitting diode. *Adv. Mater.* 22, 531-534 (2010).

Non-Patent Literature 23: Song, M. H. et al. Optically-pumped lasing in hybrid organic-inorganic light-emitting diodes. *Adv. Funct. Mater.* 19, 2130-2136 (2009).

Non-Patent Literature 24: Kim, S. Y. et al. Organic light-emitting diodes with 30% external quantum efficiency based on horizontally oriented emitter. *Adv. Funct. Mater.* 23, 3896-3900 (2013).

Non-Patent Literature 25: Uoyama, H. et al. Highly efficient organic light-emitting diodes from delayed fluorescence. *Nature* 492, 234-238 (2012).

Non-Patent Literature 26: Matsushima, T. & Adachi, C. Suppression of exciton annihilation at high current densities in organic light-emitting diode resulting from energy-level alignments of carrier transport layers. *Appl. Phys. Lett.* 92, 063306 (2008).

Non-Patent Literature 27: Kuwae, H. et al. Suppression of external quantum efficiency roll-off of nanopatterned organic light-emitting diodes at high current densities. *J. Appl. Phys.* 118, 155501 (2015).

Non-Patent Literature 28: Bisri, S. Z. et al. High mobility and luminescent efficiency in organic single-crystal light-emitting transistors. *Adv. Funct. Mater.* 19, 1728-1735 (2009).

Non-Patent Literature 29: Tian, Y. et al. Spectrally narrowed edge emission from organic light-emitting diodes. *Appl. Phys. Lett.* 91, 143504 (2007).

Non-Patent Literature 30: El-Nadi, L. et al. Organic thin film materials producing novel blue laser. *Chem. Phys. Lett.* 286, 9-14 (1998).

Non-Patent Literature 31: Wang, X., Wolfe, B. & Andrews, L. Emission spectra of group 13 metal atoms and indium hybrids in solid $H_2$ and $D_2$. *J. Phys. Chem. A* 108, 5169-5174 (2004).

Non-Patent Literature 32: Ribierre, J. C. et al. Amplified spontaneous emission and lasing properties of bisfluorene-cored dendrimers. *Appl. Phys. Lett.* 91, 081108 (2007).

Non-Patent Literature 33: Schneider, D. et al. Ultrawide tuning range in doped organic solid-state lasers. *Appl. Phys. Lett.* 85, 1886-1888 (2004).

Non-Patent Literature 34: Murawski, C., Leo, K. & Gather, M. C. Efficiency roll-off in organic light-emitting diodes. *Adv. Mater.* 25, 6801-6827 (2013).

Non-Patent Literature 35: Nakanotani, H. et al. Spectrally narrow emission from organic films under continuous-wave excitation. *Appl. Phys. Lett.,* 90, 231109 (2007).

Non-Patent Literature 36: Nakanotani, H., Sasabe, H. & Adachi, C. Singlet-singlet and singlet-heat annihilations in fluorescence-based organic light-emitting diodes under steady-state high current density. *Appl. Phys. Lett.,* 86, 213506 (2005).

Non-Patent Literature 37: Nicolai, H. T., Mandoc, M. M. & Blom, P. W. M. Electron traps in semiconducting polymers: Exponential versus Gaussian trap distribution. *Phys. Rev. B* 83, 195204 (2011).

Non-Patent Literature 38: Connell, G. A. N., Camphausen, D. L. & Paul, W. Theory of Poole-Frenkel conduction in low-mobility semiconductors. *Philos. Mag.* 26, 541-551 (1972).

Non-Patent Literature 39: Pautmeier, L., Richert, R. & Bässler, H. Poole-Frenkel behavior of charge transport in organic solids with off-diagonal disorder studied by Monte Carlo simulation. *Synth. Met.* 37, 271-281 (1990).

Non-Patent Literature 40: Pope, M. & Swenberg, C. E. *Electronic Processes in Organic Crystals and Polymers.* New York: Oxford Univ. Press, 1999.

Non-Patent Literature 41: Setoguchi, Y. & Adachi, C. Suppression of roll-off characteristics of electroluminescence at high current densities in organic light emitting diodes by introducing reduced carrier injection barriers. *J. Appl. Phys.* 108, 064516 (2010).

SUMMARY OF INVENTION

To that effect, a laser oscillation current-injection OSLD is not yet provided. An object of the present invention is to provide a laser oscillation current-injection OSLD. As a result of assiduous studies, the present inventors have found that the object can be attained by the present invention. The present invention provides a current-injection organic semiconductor laser diode comprising a pair of electrodes, an optical resonator structure, and one or more organic layers including a light amplification layer composed of an organic semiconductor, which may satisfy at least one of "2" to "16" below and/or may have at least one embodiment described below. The present invention includes the following embodiments:

1. A current-injection organic semiconductor laser diode comprising a pair of electrodes, an optical resonator structure, and one or more organic layers including a light amplification layer composed of an organic semiconductor, which has a sufficient overlap between the distribution of exciton density and the electric field intensity distribution of the resonant optical mode during current injection to emit laser light.

2. The current-injection organic semiconductor laser diode according to item 1, wherein the optical resonator structure has a distributed feedback (DFB) structure.

3. The current-injection organic semiconductor laser diode according to item 2, wherein the optical resonator structure is composed of a second-order Bragg scattering region surrounded by a first-order Bragg scattering region.

4. The current-injection organic semiconductor laser diode according to item 2, wherein the second-order Bragg scattering region and the first-order Bragg scattering region are formed alternately in the optical resonator structure.

5. The current-injection organic semiconductor laser diode according to any one of items 1 to 4, wherein the number of the one or more organic layers is 2 or less.

6. The current-injection organic semiconductor laser diode according to any one of items 1 to 5, wherein the thickness of the light amplification layer relative to the total thickness of the one or more organic layers is more than 50%.

7. The current-injection organic semiconductor laser diode according to any one of items 1 to 6, wherein the organic semiconductor contained in the light amplification layer is amorphous.

8. The current-injection organic semiconductor laser diode according to any one of items 1 to 7, wherein the molecular weight of the organic semiconductor contained in the light amplification layer is 1000 or less.

9. The current-injection organic semiconductor laser diode according to any one of items 1 to 8, wherein the organic semiconductor contained in the light amplification layer is a non-polymer.

10. The current-injection organic semiconductor laser diode according to any one of items 1 to 9, wherein the organic semiconductor contained in the light amplification layer has at least one stilbene unit.

11. The current-injection organic semiconductor laser diode according to any one of items 1 to 10, wherein the organic semiconductor contained in the light amplification layer has at least one carbazole unit.

12. The current-injection organic semiconductor laser diode according to any one of items 1 to 11, wherein the organic semiconductor contained in the light amplification layer is 4,4'-bis[(N-carbazole)styryl]biphenyl (BSBCz).

13. The current-injection organic semiconductor laser diode according to any one of items 1 to 12, which has an electron injection layer as one of the organic layers.

14. The current-injection organic semiconductor laser diode according to item 13, wherein the electron injection layer contains Cs.

15. The current-injection organic semiconductor laser diode according to any one of items 1 to 14, which has a hole injection layer as an inorganic layer.

16. The current-injection organic semiconductor laser diode according to item 15, wherein the hole injection layer contains molybdenum oxide.

17. A method for designing a current-injection organic semiconductor laser diode, comprising:
 selecting materials and designing structure of the diode so as to increase the overlap between the distribution of exciton density and the electric field intensity distribution of the resonant optical mode during current injection.

18. A method for producing a current-injection organic semiconductor laser diode, comprising:
 evaluating the overlap between the exciton density distribution and the electric field intensity distribution of the resonant optical mode during current injection in a designed or existing diode,
 changing at least one of the material and the structure of the diode to so design a new diode as to increase the overlap between the distribution of exciton density and the electric field intensity distribution of the resonant optical mode during current injection, and
 producing the new diode.

19. A current-injection organic semiconductor laser diode produced by the method of item 18.

20. A program for designing current-injection organic semiconductor laser diode, which designs a current-injection organic semiconductor laser diode to increase the overlap between the distribution of exciton density and the electric field intensity distribution of the resonant optical mode during current injection.

BRIEF DESCRIPTION OF DRAWINGS

FIG. 1: Organic semiconductor DFB laser diode structure. a, Schematic representation of the organic laser diodes. b, c, Laser microscope (b) and SEM images (c) at 5,000× and 200,000× (inset) magnification of a DFB $SiO_2$ grating structure prepared on top of ITO. d, Cross-section SEM images of a complete OSLD. e, Cross-section EDX images of the OSLD. To improve visibility of the low-concentration Cs, contrast was enhanced.

FIG. 2: Fabrication and structure of the OSLDs. a, Schematic of the fabrication steps for the OSLDs. b, Structure of the ITO-coated glass substrates used in this study along with the general structure of the DFB gratings. Detailed values of the different grating parameters can be found in Table 1. c, d, EDX and SEM analysis of mixed-order DFB grating prepared on top of ITO. These images confirm the possibility to achieve electrical contact with ITO.

FIG. 3: Electrical properties of electrically pumped organic semiconductor DFB laser. a, Energy level diagram of the OSLDs with highest occupied and lowest unoccupied molecular orbital levels indicated for the organic and work functions for the inorganics. b, Photomicrographs of an OSLD and a reference OLED under DC operation at 3.0 V. The lengths of the individual first- and second-order grating regions are 1.68 and 1.12 μm. c, d, Current density-voltage (J-V) characteristics (c) and $\eta_{EQE}$-J characteristics (d) in the OLED and OSLD under pulsed operation (pulse width of 400 ns and repetition rate of 1 kHz).

FIG. 4: Hole and electron transport in the organic layers. a, b, Architectures of the hole-only device (a) and electron-only device (b) used to evaluate the transport. c, Representative current density-voltage (J-V) characteristics in the hole-only devices (HOD) and electron-only devices (EOD) under DC operation (filled symbols) and pulse operation (empty symbols) on log and linear (inset) scales. Device area is 200×200 μm. These J-V curves indicate good transport of holes and electrons in the high voltage region in the laser diodes fabricated in this study. Current at low voltages is higher for electrons than holes because of trap limiting of the hole current.

FIG. 5: Properties of OSLDs with different DFB geometries. a, Photomicrographs of OSLDs under DC operation at 3.0 V. The photomicrographs were take using the same magnification, and all grating run vertically. b, c, d, Current density-voltage (J-V) and $\eta_{EQE}$-J characteristics of the OSLDs. e, Electroluminescence intensity and FWHM as a function of J. f, Emission spectra collected in the direction normal to the substrate plane as a function of J.

FIG. 6: Direct-current characteristics and emission spectra of devices. a, b, Current density-voltage (J-V) curves (a) and $\eta_{EQE}$-J curves (b) of the OLED and OSLD measured under DC operation. c, PL spectra of a neat BSBCz film (black line) and EL spectra of the OLED (red line) and OSLD below the lasing threshold (blue line).

FIG. 7: Lasing properties of OSLDs. a, Emission spectra of an OSLD collected in the direction normal to the substrate plane for different injected current densities. At current densities higher than 3.5 kA cm$^{-2}$, serious device degradation at the lasing wavelength results in a strong increase in the background EL relative to the lasing. b, Emission spectra near the lasing threshold. c, Output intensity and FWHM as a function of the current. d, Output power as a function of the current. The inset is a photograph of an OSLD under pulsed operation at 50 V.

FIG. 8: Characterization of the emission from OSLDs. a, Emission spectra of an OSLD above threshold measured at different polarization angles. Polarization is stronger above threshold (inset, circles) than below threshold (inset, triangles). Here, 90° corresponds to the direction parallel to the grooves of the DFB grating. b, c, CCD camera images (b) and cross-sections (c) showing the spatial Gaussian profiles of a focused emission beam from an OSLD at different current densities. d, e, Unfocused beam of an OSLD operating above threshold projected on a screen.

FIG. 9: Characteristics of OSLD under optical pumping. a, Test set-up used to measure the beam profile in FIG. 8b, c. b, Characteristics and near-field beam images and cross-sections of an OSL (see Table 1 for structure) under optical excitation below threshold (i), near threshold (ii), and above threshold (iii). c, Characteristics and near-field beam images and cross-sections of an OSLD-6 (see Table 1 for structure) under optical excitation below threshold (iv), near threshold (v), and above threshold (v). d, Far-field beam cross-sections of an OSL under optical excitation above threshold, near threshold, and below threshold along with the simulated far-field beam above threshold. The inset for above threshold is the original emission pattern. e, Emission spectra collected in the direction normal to the substrate plane for OSLD-6 under optical pumping with different photoexcitation densities. The steady-state photoluminescence spectra of BSBCz on SiO$_2$ with a grating is shown as a dashed line. f, Output intensity and FWHM of OSLD-6 as a function of the photoexcitation density. Excitation was for 3.0 ns by a N$_2$ laser at 337 nm, and the device was at ambient temperature. g, h, i, Slope efficiency of an optically pumped OSL (g, see Table 1 for structure), an electrically pumped OSLD (h), and an optically pumped OSLD-6 (i). Input power for the optically pumped devices is the power of the source and was incident on the organic film side for the OSL and the glass side for the OSLD-6.

FIG. 10: Absorption spectra of triplets and radical cations and anions of BSBCz. a, Stimulated emission and triplet absorption cross-section spectra of BSBCz. Emission spectra of the OSL were measured from a BSBCz neat film above threshold. b, To investigate the spectral overlap between the components, the absorption spectra of neat films of BSBCz (50 nm, black) and composite films BSBCz:MoO$_3$ and BSBCz:Cs, (1:1 mol ratio, 50 nm; blue and red, respectively) were measured. The absorption spectra were measured using an absorption spectrometer (Lamda 950, PerkinElmer). The steady-state PL spectrum of a BSBCz neat film (green) and a representative laser emission spectrum (orange) from an OSL under optical pumping are also displayed to show that polaron absorption in BSBCz OSLDs should be negligible.

FIG. 11: Optical and electrical simulations. a, Experimental (symbol) and simulated (solid line) J-V curves for hole-only device (blue circles), electron-only device (red squares), and bipolar device (black triangles). Model parameters were extracted by fitting to the unipolar devices from FIG. 4, and those parameters were used for simulating the bipolar device. b, Comparison of mobilities calculated using the parameters extracted from the unipolar devices (solid lines) with reported[41] mobilities (symbols) for holes (blue) and electrons (red) in BSBCz. c, Experimental (symbols) and simulated (solid line) J-V curves for the OSLD. d, Schematic of the OSLD structure used for the calculations. e, Spatial distribution of the recombination rate profile, R, for the OSLD at J=500 mA cm$^{-2}$. f, Cross section through (e) at y=0.11 μm for the DFB device. g, Average exciton density as a function of the current density for the OSLD and OLED.

FIG. 12: Simulations of the OSLD. a, Spatial distribution of the exciton density, S. b, Electric field distribution of the passive DFB resonant cavity at the resonant wavelength $\lambda_0$=483 nm for a structure extended to include first-order regions. c, Modal gain as a function of current density. d, Spatial overlap between the exciton density S(x, y) and the optical mode $|E(x, y)|^2$ for one period in the second-order region at J=500 A cm$^{-2}$. Layers other than the grating were modeled as being flat (see FIG. 11d), and y=0 corresponds to the BSBCz/MoO$_3$ interface.

DETAILED DESCRIPTION OF INVENTION

The contents of the invention will be described in detail below. The constitutional elements may be described below with reference to representative embodiments and specific examples of the invention, but the invention is not limited to the embodiments and the examples. In the present specification, a numerical range expressed by "from X to Y" means a range including the numerals X and Y as the lower limit and the upper limit, respectively.

All the literatures and the description of PCT/JP2017/033366 as referred to herein are incorporated herein by reference.

The current-injection OSLD of the present invention contains at least a pair of electrodes, an optical resonator structure and one or more organic layers containing a light amplification layer composed of an organic semiconductor. The current-injection OSLD of the present invention is provided with a constitution where the overlap between the distribution of exciton density and the electric field intensity distribution of the resonant optical mode during current injection is sufficient to emit laser light. The "constitution where the overlap between the distribution of exciton density and the electric field intensity distribution of the resonant optical mode during current injection is sufficient to emit laser light" is a constitution to enable laser oscillation, and means selection and combination of materials and structures to be described below.

The constitution and the characteristics of the present invention are described in detail hereinunder.

(Light Amplification Layer)

The light amplification layer to constitute the current-injection OSLD of the present invention includes an organic semiconductor compound containing a carbon atom but not containing a metal atom. Preferably, the organic semiconductor compound is composed of one or more atoms selected from the group consisting of a carbon atom, a hydrogen atom, a nitrogen atom, an oxygen atom, a sulfur atom, a phosphorous atom, and a boron atom. For example, there may be mentioned an organic semiconductor compound composed of a carbon atom, a hydrogen atom and a nitrogen atom. A preferred example of the organic semiconductor compound is a compound having at least one of a stilbene unit and a carbazole unit, and a more preferred example of the organic semiconductor compound is a compound having both of a stilbene unit and a carbazole unit. The stilbene unit and the carbazole unit may be substituted with a substituent such as an alkyl group or the like, or may be unsubstituted. Preferably, the organic semiconductor compound is a non-polymer not having a repeating unit. Preferably, the molecular weight of the compound is 1000 or less, for example, it may be 750 or less. The light amplification layer may contain 2 or more kinds of organic semiconductor compounds, but preferably contains only one kind of an organic semiconductor compound.

The organic semiconductor compound for use in the present invention may be selected from laser gain organic semiconductor compounds that enable laser oscillation when used in an organic light emitting layer of a photoexcitation organic semiconductor laser. One of the most preferable organic semiconductor compound is 4,4'-bis[(N-carbazole)styryl]biphenyl (BSBCz) (chemical structure in FIG. 1a)[15] because of its excellent combination of optical and electrical properties such as a low amplified spontaneous emission (ASE) threshold in thin films (0.30 µJ cm$^{-2}$ under 800-ps pulse photoexcitation)[16] and the ability to withstand the injection of current densities as high as 2.8 kA cm$^{-2}$ under 5-µs pulse operation in OLEDs with maximum electroluminescence (EL) external quantum efficiencies ($\eta_{EQE}$) of over 2%[13]. Furthermore, lasing at a high repetition rate of 80 MHz and under long pulse photoexcitation of 30 ms were recently demonstrated in optically pumped BSBCz-based DFB lasers[17] and were largely possible because of the extremely small triplet absorption losses at the lasing wavelength of BSBCz films. Apart from BSBCz, also employable are, for example, compounds having an ASE threshold of preferably 0.60 µJ cm$^{-2}$ or less, more preferably 0.50 µJ cm$^{-2}$ or less, even more preferably 0.40 µJ cm$^{-2}$ or less, when formed into the same thin film as in the literature 16 and measured under the 800-ps pulse photoexcitation condition. In addition, compounds are employable, which exhibit durability of preferably 1.5 kA cm$^{-2}$ or more, more preferably 2.0 kA cm$^{-2}$ or more, even more preferably 2.5 kA cm$^{-2}$ or more, when formed into the same device as in the literature 13 and measured under the 5-µs pulse operation condition.

The thickness of the light amplification layer to constitute the current-injection OSLD of the present invention is preferably 80 to 350 nm, more preferably 100 to 300 nm, even more preferably 150 to 250 nm.

(Other Layers)

The current-injection OSLD of the present invention may have an electron injection layer, a hole injection layer and others in addition to the light amplification layer. These may be organic layers or inorganic layers free from organic materials. In the case where the current-injection OSLD has two or more organic layers, it preferably has a laminate structure of organic layers alone not having any non-organic layer therebetween. In this case, the two or more organic layers may contain the same organic compound as in the light amplification layer. The performance of the current-injection OSLD tends to be better when the number of the heterointerfaces of the organic layers therein is smaller, and therefore, the number of the organic layers therein is preferably 3 or less, more preferably 2 or less, most preferably 1. In the case where the current-injection OSLD has 2 or more organic layers, preferably, the thickness of the light amplification layer is more than 50% of the total thickness of the organic layers, more preferably more than 60%, even more preferably more than 70%. When the current-injection OSLD has 2 or more organic layers, the total thickness of the organic layers may be, for example, 100 nm or more, 120 nm or more, or 170 or more, and may be 370 nm or less, 320 nm or less, or 270 nm or less. Preferably, the refractive index of the electron injection layer and the hole injection layer is smaller than the refractive index of the light amplification layer.

In the case where an electron injection layer is provided, a substance facilitating electron injection into the light amplification layer is made to exist in the electron injection layer. In the case where a hole injection layer is provided, a substance facilitating hole injection into the light amplification layer is made to exist in the hole injection layer. These substances may be an organic compound or an inorganic substance. For example, the inorganic substance for the electron injection layer includes an alkali metal such as Cs, etc., and the concentration thereof in the electron injection layer containing an organic compound may be, for example, 1% by weight more, or 5% by weight or more, or 10% by weight or more, and may be 40% by weight or less, or 30% by weight or less. The thickness of the electron injection layer may be, for example, 3 nm or more, 10 nm or more, or 30 nm or more, and may be 100 nm or less, 80 nm or less, or 60 nm or less.

As one preferred embodiment of the present invention, a current-injection OSLD provided with an electron injection layer and a light amplification layer as organic layers, and with a hole injection layer as an inorganic layer may be exemplified. The inorganic substance to constitute the hole injection layer includes a metal oxide such as molybdenum oxide, etc. The thickness of the hole injection layer may be, for example, 1 nm or more, 5 nm or more, or 10 nm or more, and may be 100 nm or less, 50 nm or less, or 20 nm or less.

(Optical Resonator Structure)

The current-injection OSLD of the present invention has an optical resonator structure. The optical resonator structure may be a one-dimensional resonator structure or a two-dimensional resonator structure. Examples of the latter include a circulator resonator structure, and a whispering gallery type optical resonator structure. A distributed feedback (DFB) structure and a distributed Bragg reflector (DBR) structure are also employable. For DFB, a mixed-order DFB grating structure is preferably employed. Namely, a mixed structure of DFB grating structures differing in point of the order relative to laser emission wavelength may be preferably employed. Specific examples thereof include an optical resonator structure composed of a second-order Bragg scattering region surrounded by the first-order Bragg scattering region and a mixed structure where a second-order Bragg scattering region and a first-order scattering region are formed alternately. For details of preferred optical resonator structures, specific examples to be given hereinunder may be referred to. As the optical resonator structure, the current-injection OSLD may be further provided with an external optical resonator structure.

For example, the optical resonator structure may be formed preferably on an electrode. The material to constitute the optical resonator structure includes an insulating material such as $SiO_2$, etc. For example, a grating structure is formed, the depth of the grating is preferably 75 nm or less, and is more preferably selected from a range of 10 to 75 nm. The depth may be, for example, 40 nm or more, or may be less than 40 nm.

(Electrode)

The current-injection OSLD of the present invention has a pair of electrodes. For light output, one electrode is preferably transparent. For the electrode, an electrode material generally used in the art may be appropriately selected in consideration of the work function thereof, etc. Preferred electrode materials include, though not limited thereto, Ag, Al, Au, Cu, ITO, etc.

(Preferred Current-Injection OSLD)

In the current-injection OSLD, excitons are generated by current excitation. The laser oscillation characteristics of the current-injection OSLD is improved by enlarging the overlap between the distribution region of the generated exciton density and the electric field intensity distribution of the resonant optical mode. Namely, when the exciton density overlaps with the optical resonant mode of the optical resonator structure, the laser oscillation characteristics can be thereby improved. The exciton density distribution and the electric field intensity distribution of the resonant optical mode can be controlled by changing the structure and the material of the current-injection OSLD. For example, by employing a current narrowing structure with grating or the like, and by controlling the depth and the period of the grating, the distributions can be controlled. By specifying or controlling the materials and the thickness of the light amplification layer, and also the materials and the thickness of an electron injection layer and a hole injection layer, if any, the distributions can also be controlled. Further, a more accurate distribution control is also possible in view of the conditions taken into consideration in the simulation calculation to be given below. Preferable current-injection OSLD has an overlap between the distribution of exciton density and the electric field intensity distribution of the resonant optical mode during current injection to an extent equal to or more than the overlap in the specific current-injection OSLD shown as a working example below.

In the current-injection OSLD of the present invention, preferably, the ratio of an electron mobility to a hole mobility in the organic optical gain layer is controlled to fall within a range of preferably 1/10 to 10/1, more preferably 1/5 to 5/1, still more preferably 1/3 to 3/1, still further more preferably 1/2 to 2/1. By controlling the ratio to fall within the range, the overlap between the exciton density distribution and the electric field intensity distribution of the resonant optical mode can be readily enlarged.

In the current-injection OSLD of the present invention, preferably, the excitons generated by current excitation do not substantially undergo annihilation. The loss by the exciton annihilation is preferably less than 10%, more preferably less than 5%, further more preferably less than 1%, still further more preferably less than 0.1%, still further more preferably less than 0.01%, and most preferably 0%.

Also preferably, the current-injection OSLD of the present invention shows no substantial polaron absorption loss at a lasing wavelength. In other words, preferably, there is no substantial overlap between the polaron absorption spectrum and the emission spectrum of the organic semiconductor laser. The loss by the polaron absorption is preferably less than 10%, more preferably less than 5%, further more preferably less than 1%, still further more preferably less than 0.1%, still further more preferably less than 0.01%, and most preferably 0%.

Preferably, the oscillation wavelength of the current-injection OSLD of the present invention does not substantially overlap with the absorption wavelength region of an excited state, a radical cation, or a radical anion. Absorption in them may be caused by singlet-singlet, triplet-triplet, or polaron absorption. The loss by absorption in an excited state is preferably less than 10%, more preferably less than 5%, further more preferably less than 1%, still further more preferably less than 0.1%, still further more preferably less than 0.01%, and most preferably 0%.

Preferably, the current-injection OSLD of the present invention is free from a triplet quencher.

(Production Method for Current-Injection OSLD)

The present invention also provides a production method for the current-injection OSLD where the current-injection OSLD is designed and produced so that the overlap between the distribution of the exciton density generated by current excitation and the electric field intensity distribution of the resonant optical mode can be large. In designing it, simulation is carried out on the basis of various conditions, for example, the depth and the period of grating, and the constituent material and the thickness of the light amplification layer, the electron injection layer and the hole injection layer, etc., and the overlap between the exciton density distribution and the electric field intensity distribution of the resonant optical mode is thereby evaluated. As a result of simulation under various conditions, ones with no problem in production are selected from those where the overlap is evaluated to be large, and the thus-selected ones may be actually produced. Accordingly, current-injection OSLDs having excellent laser oscillation characteristics can be efficiently provided.

In designing the above, a design program for current-injection OSLDs having a function of so designing them in such a manner that the overlap between the distribution of the excitons to be generated by current excitation and the electric field intensity distribution of the resonant optical mode can be enlarged may be previously formed and used. The program can be stored in a media such as a hard disc and a compact disc.

Also, the present invention provides a method for improving the laser oscillation characteristics of designed or existing current-injection OSLDs. The overlap between the exciton density distribution and the electric field intensity distribution of the resonant optical mode in designed or existing current-injection OSLDs is evaluated according to simulation calculation, and the distribution overlap in the case where the materials and the structure have been changed is also calculated through the same simulation calculation, and accordingly, current-injection OSLDs that have improved laser oscillation characteristics can be thereby provided.

Preferred Embodiments of Invention

Hereinunder the present invention will be described concretely with reference to the preferred embodiment shown in FIG. 1a. However, the scope of the present invention should not be limitatively interpreted by the following concrete description.

The properties of optically pumped organic semiconductor lasers (OSLs) have dramatically improved in the last two decades as a result of major advances in both the development of high-gain organic semiconductor materials and the design of high-quality-factor resonator structures[1-5]. The advantages of organic semiconductors as gain media for lasers include their high photoluminescence (PL) quantum yields, large stimulated emission cross sections, and broad emission spectra across the visible region along with their chemical tunability and ease of processing. Owing to recent advances in low-threshold distributed feedback (DFB) OSLs, optical pumping by electrically driven nanosecond-pulsed inorganic light-emitting diodes was demonstrated, providing a route toward a new compact and low-cost visible laser technology[6]. However, the ultimate goal is electrically driven organic semiconductor laser diodes (OSLDs). In addition to enabling the full integration of organic photonic and optoelectronic circuits, the realization of OSLDs will open novel applications in spectroscopy, displays, medical devices (such as retina displays, sensors, and photodynamic therapy devices), and LIFI telecommunications.

The problems that have prevented the realization of lasing by the direct electrical pumping of organic semiconductors are mainly due to the optical losses from the electrical contacts and the triplet and polaron losses taking place at high current densities[4,5,7-9]. Approaches that have been proposed to solve these fundamental loss issues include the use of triplet quenchers[10-12] to suppress triplet absorption losses and singlet quenching by singlet-triplet exciton annihilation as well as the reduction of the device active area[13] to spatially separate where exciton formation and exciton radiative decay occur and minimize the polaron quenching processes. However, even with the advances that have been made in organic light-emitting diodes (OLEDs) and optically pumped organic semiconducting DFB lasers[5], a current-injection OSLD has still not been conclusively demonstrated.

Previous studies have suggested that current densities over a few kA/cm² would be required to achieve lasing from an OSLD if additional losses associated with the electrical pumping were completely suppressed[14]. One of the most promising molecules for the realization of an OSLD is 4,4'-bis[(N-carbazole)styryl]biphenyl (BSBCz) (chemical structure in FIG. 1a)[15] because of its excellent combination of optical and electrical properties such as a low amplified spontaneous emission (ASE) threshold in thin films (0.30 µJ cm$^{-2}$ under 800-ps pulse photoexcitation)[16] and the ability to withstand the injection of current densities as high as 2.8 kA cm$^{-2}$ under 5-µs pulse operation in OLEDs with maximum electroluminescence (EL) external quantum efficiencies ($\eta_{EQE}$) of over 2%[13]. Furthermore, lasing at a high repetition rate of 80 MHz and under long pulse photoexcitation of 30 ms were recently demonstrated in optically pumped BSBCz-based DFB lasers[17] and were largely possible because of the extremely small triplet absorption losses at the lasing wavelength of BSBCz films. Here, the inventors undoubtedly demonstrate the first examples of lasing from an organic semiconductor film directly excited by electricity through the development and complete characterization of OSLDs based on a BSBCz thin film in an inverted OLED structure with a mixed-order DFB SiO$_2$ grating integrated into the active area of the device.

The architecture and fabrication of the OSLDs developed in this study are schematically represented in FIG. 1a and in FIG. 2 (see the Materials and Methods for a detailed description of the experimental procedures). A sputtered layer of SiO$_2$ on indium tin oxide (ITO) glass substrates was engraved with electron beam lithography and reactive ion etching to create mixed-order DFB gratings with an area of 30×90 µm (FIG. 1b), and organic layers and a metallic cathode were vacuum deposited on the substrates to complete the devices. The inventors designed the mixed-order DFB gratings to have first- and second-order Bragg scattering regions that provide strong optical feedback and efficient vertical outcoupling of the laser emission, respectively[17,18]. Grating periods ($\Lambda_1$ and $\Lambda_2$) of 140 and 280 nm were chosen for the first- and second-order regions, respectively, based on the Bragg condition[4,19], $m\lambda_{Bragg}=2n_{eff}\Lambda_m$, where m is the order of diffraction, $\lambda_{Bragg}$ is the Bragg wavelength, which was set to the reported maximum gain wavelength (477 nm) for BSBCz, and $n_{eff}$ is the effective refractive index of the gain medium, which was calculated to be 1.70 for BSBCz[20,21]. The lengths of the individual first- and second-order DFB grating regions were 1.12 and 1.68 µm, respectively, in the first set of devices characterized, hereafter referred to as OSLDs.

The scanning electron microscopy (SEM) images in FIGS. 1c and d confirm that the fabricated DFB gratings had periods of 140±5 and 280±5 nm with a grating depth of about 65±5 nm. Complete removal of the SiO$_2$ layer in the etched areas to expose the ITO is important for making good electrical contact with the organic layer and was verified with energy dispersive X-ray spectroscopy (EDX) analysis (FIG. 2c, d). Cross-sectional SEM and EDX images of a complete OSLD are shown in FIGS. 1d and e. The surface morphologies of all layers present a grating structure with a surface modulation depth of 50-60 nm. Although the interaction of the resonating laser mode with the electrodes is expected to reduce the quality factor of the feedback structure, such a grating structure on the metal electrode should also reduce the absorption losses of a mode guided within the device structure[22,23].

The OSLDs fabricated in this work have a simple inverted OLED structure of ITO (100 nm)/20 wt. % Cs:BSBCz (60 nm)/BSBCz (150 nm)/MoO$_3$ (10 nm)/Ag (10 nm)/Al (90 nm) with the energy levels as shown in FIG. 3a (working example). Doping the BSBCz film with Cs in the region close to the ITO contact improves the electron injection into the organic layer, and MoO$_3$ is used as a hole injection layer (FIG. 4). While the most efficient OLEDs generally use multilayer architectures to optimize charge balance[24,25], charges can accumulate at organic hetero-interfaces at high current densities, which can be detrimental for device performance and stability[26]. The OSLDs fabricated in this work contained only BSBCz as the organic semiconductor layer (light amplification layer) and were specifically designed to minimize the number of organic hetero-interfaces. Reference devices without an SiO$_2$ DFB grating, hereafter referred to as OLEDs, were also fabricated to investigate the influence of the gratings on the EL properties.

FIG. 3b shows optical microscope images of an OSLD and a reference OLED under direct current (DC) operation at 3.0 V. In addition to the previously described DFB grating, five other DFB grating geometries (Table 1) were optimized and characterized in OSLDs. While the EL is emitted homogeneously from the active area of the reference OLEDs, more intense emission can be seen from the second-order DFB grating regions, which were specifically designed to promote vertical light outcoupling, in the OSLDs (FIG. 3b and FIG. 5). The current density-voltage (J-V) and $\eta_{EQE}$-J characteristics in an OSLD and OLED under pulsed conditions (voltage pulse width of 400 ns and repetition rate of 1 kHz) at ambient temperatures are shown in FIGS. 2c and d, and the characteristics obtained under DC conditions are displayed in FIG. 6. Though some current flows through the areas above the SiO$_2$ grating (~20% based on simulations), most flows through the areas above the exposed ITO. For simplicity and consistency, the exposed ITO area was used for the calculation of current density for all OSLDs, though this may lead to slight overestimations.

TABLE 1

Parameters for the different OSLD geometries

| Device | w (μm) | l (μm) | $\Lambda_1$ (nm) | $\Lambda_2$ (nm) | $w_1$ (μm) | $w_2$ (μm) | A (μm$^2$) |
|---|---|---|---|---|---|---|---|
| OLED | 30 | 45 | — | — | — | — | 1,350 |
| OSLD | 30 | 90 | 140 | 280 | 1.68 | 1.12 | 1,350 |
| OSLD-1 | 35 | 90 | 140 | 280 | 14.00 | 7.00 | 1,575 |
| OSLD-2 | 90 | 30 | 140 | 280 | 1.68 | 1.12 | 1,350 |
| OSLD-3 | 101 | 30 | 140 | 280 | 45.36 | 10.08 | 1,515 |
| OSLD-4 | 30 | 90 | 134 | 268 | 1.608 | 1.072 | 1,350 |
| OSLD-5 | 30 | 90 | 146 | 292 | 1.752 | 1.168 | 1,350 |
| OSLD-6 | 560 | 800 | 140 | 280 | 1.68 | 1.12 | 224,000 |
| OSL | 5,000 | 5,000 | 140 | 280 | 15.12 | 10.08 | — |

Values of the different grating geometries for the parameters shown in FIG. 2 along with the total exposed ITO area A used for calculating current density. The OSL is a 200-nm-thick layer of BSBCz deposited on a grating on a fused silica substrate and does not included contacts.

The maximum current densities before device breakdown of the reference OLEDs increased from 6.6 A cm$^{-2}$ under DC operation to 5.7 kA cm$^{-2}$ under pulse operation because of reduced Joule heating with pulse operation[13,27]. Under DC operation, all of the devices exhibited maximum $\eta_{EQE}$ higher than 2% at low current densities and strong efficiency rolloff at current densities higher than 1 A cm$^{-2}$, which is presumably due to thermal degradation of the devices. On the other hand, efficiency rolloff in the OLEDs under pulse operation (FIG. 3c, d) began at current densities higher than 110 A cm$^{-2}$, consistent with a previous report[13]. Efficiency rolloff was further suppressed in the OSLDs under pulse operation, and the $\eta_{EQE}$ was even found to substantially increase above 200 A cm$^{-2}$ to reach a maximum value of 2.9%. The rapid decrease in $\eta_{EQE}$ above a current density of 2.2 kA cm$^{-2}$ is likely due to thermal degradation of the device.

While the EL spectra of the OLEDs are similar to the steady-state PL spectrum of a neat BSBCz film (FIG. 6c) and did not change as a function of the current density, the EL spectra from the glass face of the OSLDs under pulse operation exhibited spectral line narrowing with increasing current density (FIG. 7a). A Bragg dip corresponding to the stopband of the DFB grating was observed at 478.0 nm for current densities below 650 A cm$^{-2}$ (FIG. 7b). As the current density increased above this value, strong spectral line narrowing occurs at 480.3 nm, suggesting the onset of lasing. The intensity of the narrow emission peak was found to increase faster than that of the EL emission background, which could be attributed to the non-linearity associated with stimulated emission.

The output intensity and full-width-at-half-maximum (FWHM) of an OSLD are plotted in FIG. 7c as a function of the current. While the FWHM of the steady-state PL spectrum of a neat BSBCz film is around 35 nm, the FWHM of the OSLD at high current densities decreases to values lower than 0.2 nm, which is close to the spectral resolution limit of the spectrometer used in the invention (0.17 nm for a wavelength range of 57 nm). The slope efficiency of the output intensity abruptly changes with increasing current and can be used to determine a threshold of 600 A cm$^{-2}$ (8.1 mA). Above 4.0 kA cm$^{-2}$, the output intensity decreases with increasing current, presumably because of a strong increase of temperature leading to the onset of device breakdown, but the emission spectrum remains extremely sharp. This increase and subsequent decrease is consistent with the $\eta_{EQE}$-J curve. The maximum output power measured with a power meter placed in front of an OSLD at a distance of 3 cm away from the ITO glass substrate (FIG. 7d) was 0.50 mW at 3.3 kA cm$^{-2}$. These observed EL properties strongly suggest that light amplification occurs at high current densities and that electrically driven lasing is achieved above a current density threshold.

Beam polarization and shape were characterized to provide further evidence that this is lasing[9]. The output beam of an OSLD is strongly linearly polarized along the grating pattern (FIG. 8a), which is expected for laser emission from a one-dimensional DFB. Spatial profiles of focused OSLD emission (FIG. 8b and FIG. 9a) show the existence of well-defined Gaussian beams with a diameter of around 0.1 mm (FIG. 8c), demonstrating the excellent focusability of the output beam from the OSLD above the lasing threshold. Projection of the beam on a screen results in a fan-shaped pattern as expected for a one-dimensional DFB (FIG. 8d, e). Rapid degradation above threshold prevented interferometry measurements at this stage, but the inventors estimated coherence lengths (L) from the equation L=$\lambda_{peak}^2$/FWHM, where $\lambda_{peak}$ is the peak wavelength, of 1.1-1.3 mm for all of the devices in this report, which is also consistent with lasing. Under optical excitation, which results in slower degradation, near-field beam patterns of similar device structures with and without the electrodes (FIG. 9b, c) are similar, further indicating that the devices can support lasing. Additionally, the far-field patterns under optical excitation are also consistent with lasing (FIG. 9d).

Before the inventors can claim lasing, several phenomena that have been misinterpreted as lasing in the past must be ruled out as the cause of the observed behavior[9]. The emission from the inventors' OSLDs is detected in the direction normal to the substrate plane and shows a clear threshold behavior, so line narrowing arising from edge emission of waveguided modes without laser amplification can be dismissed[20,28,29]. ASE can appear similar to lasing, but the FWHM in OSLDs of the invention (<0.2 nm) is much narrower than the typical ASE linewidth of an organic thin film (a few nanometers) and is consistent with the typical FWHM of an optically pumped organic DFB lasers (<1 nm)[5]. A very narrow emission spectrum obtained by inadvertently exciting an atomic transition in ITO has also been mistaken for emission from an organic layer[30]. However, the emission peak wavelength of the OSLD in FIG. 7a is 480.3 nm and cannot be attributed to emission from ITO, which has atomic spectral lines at 410.3, 451.3, and 468.5 nm.[31]

If this truly is lasing from a DFB structure, then the emission of the OSLD should be characteristic of the resonator modes and the output should be very sensitive to any modifications of the laser cavity. Thus, OSLDs with different DFB geometries, labeled OSLD-1 through OSLD-5 (Table 1), were fabricated and characterized (FIG.

5) to confirm that the emission wavelength could be predictably tuned, which is common in optically pumped organic DFB lasers[4,5,32,33]. The lasing peaks are nearly the same for OSLD, OSLD-1, OSLD-2, and OSLD-3 (480.3 nm, 479.6 nm, 480.5 nm, and 478.5 nm, respectively), which have the same DFB grating periods. Furthermore, OSLD-1, OSLD-2, and OSLD-3 all had low minimum FWHM (0.20 nm, 0.20 nm, and 0.21 nm, respectively) and clear thresholds (1.2 kA cm$^{-2}$, 0.8 kA cm$^{-2}$, and 1.1 kA cm$^{-2}$, respectively). On the other hand, OSLD-4 and OSLD-5, which have different DFB grating periods, exhibited lasing peaks at 459.0 nm with a FWHM of 0.25 nm and a threshold of 1.2 kA cm$^{-2}$ (OSLD-4) and 501.7 nm with a FWHM of 0.38 nm and a threshold of 1.4 kA cm$^{-2}$ (OSLD-5). These results clearly demonstrate that the lasing wavelength is being controlled by the DFB geometry.

To verify that the lasing threshold of the electrically driven OSLD is consistent with that obtained by optical pumping, the lasing characteristics of an OSLD (OLSD-6) optically pumped through the ITO side using a $N_2$ laser (excitation wavelength of 337 nm) delivering 3.0-ns pulses were measured (FIG. 9e, f). The lasing peak of OLSD-6 under optical pumping (481 nm) is consistent with that of the OSLDs under electrical pumping (480.3 nm). The lasing threshold under optical pumping was measured to be around 77 W cm$^{-2}$ when considering only the power coupled into the device (~18% based on simulations). The relatively small increase in threshold compared to that obtained in optically pumped BSBCz-based DFB lasers without the two electrodes (30 W cm$^{-2}$)[17] is a result of optimization of layer thickness to minimize the optical losses arising from the presence of the electrodes. Assuming no additional loss mechanisms in OSLD-6 at high current densities, a lasing threshold of 0.3 kA cm$^{-2}$ under electrical pumping can be predicted from the threshold under optical pumping (see Materials and Methods for calculation details). Thus, the observation of lasing under electrical pumping above thresholds of 0.6-0.8 kA cm$^{-2}$ for OSLD and OSLD-2 (which have the same grating periods as OSLD-6) is reasonable. Furthermore, slope efficiency (FIG. 9g-i) was similar under optical and electrical pumping (0.4% and 0.3%, respectively), though it was markedly higher for an optically pumped device without electrodes (6%).

These results suggest that the additional losses (including exciton annihilation, triplet and polaron absorption, quenching by the high electric field, and Joule heating) generally taking place in OLEDs at high current densities[34] have been nearly suppressed in the BSBCz OSLDs. This is fully consistent with the fact that EL efficiency rolloff was not observed in the OSLDs under intense pulse electrical excitation. The suppression of losses can be explained based on the properties of BSBCz and the devices. As previously mentioned, BSBCz films do not show significant triplet losses (FIG. 10a)[35], and a decrease of the device active area leads to a reduction of Joule-heat-assisted exciton quenching[36]. The overlap between the polaron absorption and emission spectrum is negligible for both radical cations and radical anions in BSBCz based on the measurement of composite films of BSBCz:MoO$_3$ and BSBCz:Cs, respectively (FIG. 10b). Additionally, while metal losses are a major problem in OLED structures, the DFB structure in the OSLDs of the invention reduces such losses by confining the light away from the metal.

Electrical and optical simulations of the devices were performed to further confirm that current-injection lasing is occurring in the OSLDs (FIG. 11). Using carrier mobilities extracted from the fitting of experimental data for unipolar devices (FIG. 11a, b), simulated J-V curves for devices with and without a grating agreed well with the experimental characteristics (FIG. 11a, c, d), indicating sufficient etching for good electrical contact with ITO in the device with a grating. The recombination rate profile (FIG. 11e, f) shows a periodic variation inside the device because of periodic injection of electrons from the ITO electrode through the insulating SiO$_2$ grating. Similar to the recombination, exciton density (S) is spread throughout the thickness of the organic layer (FIG. 12a) but primarily concentrated in the regions where SiO$_2$ does not hinder the path from cathode to anode. The average exciton density of the OSLD and OLED (FIG. 11g) are similar, indicating that the high accumulation of excitons near the SiO$_2$ compensates for the low exciton density between the grating (no injection region) leading to a similar exciton density as for the reference device.

Light outcoupling from the second-order grating and light trapping in the ITO layer, which forms a waveguide loss, are clearly visible in the simulated electric field distribution E(x, y) of the optical field at the calculated resonant wavelength $\lambda_0$=483 nm in the OSLD (FIG. 12b). The DFB resonant cavity is characterized by a confinement factor $\Gamma$ of 40% and a quality factor of 255, which is consistent with a quality factor of 204 calculated from FIG. 7b using the equation $\lambda_{peak}$/FWHM. The modal gain ($g_m$), which is an indicator of the amplification of light in the laser mode, as a function of current density was calculated from the overlap of the exciton density distribution and optical field distribution (see Materials and Methods for details) with a stimulated emission cross section $\sigma_{stim}$ for BSBCz[35] of 2.8 10$^{-16}$ cm$^2$ and is shown in FIG. 12c for the second-order region. The high and increasing modal gain above 500 A cm$^{-2}$ is consistent with the observation of lasing. The insulating DFB structure helps to enhance coupling with the optical mode through localization of high exciton density in and above the valleys of the grating (FIG. 12a), where the optical mode is strong (FIG. 12b), resulting in the high values at J=500 A cm$^{-2}$ in FIG. 12d.

In conclusion, the present invention proves that lasing from a current-driven organic semiconductor is possible through proper design and choice of the resonator and organic semiconductor to suppress losses and enhance coupling. The lasing demonstrated here has been reproduced in multiple devices and fully characterized to exclude other phenomena that could be mistaken for lasing. The results fully support the claim that this is the first observation of electrically pumped lasing in organic semiconductors. The low losses in BSBCz are integral to enabling lasing, so the development of strategies to design new laser molecules with similar or improved properties is an important next step. This report opens new opportunities in organic photonics and serves as a basis for the future development of an organic semiconductor laser diode technology that is simple, cheap, and tunable and can enable fully and directly integrated organic-based optoelectronic platforms.

Materials and Methods (Device Fabrication)

Indium tin oxide (ITO)-coated glass substrates (100-nm-thick ITO, Atsugi Micro Co.) were cleaned by ultrasonication using neutral detergent, pure water, acetone, and isopropanol followed by UV-ozone treatment. A 100-nm-thick layer of SiO$_2$, which would become the DFB grating, was sputtered at 100° C. onto the ITO-coated glass substrates. The argon pressure during the sputtering was 0.66 Pa. The RF power was set at 100 W. Substrates were again cleaned by ultrasonication using isopropanol followed by UV-ozone treatment. The SiO$_2$ surfaces were treated with hexamethyldisilazane (HMDS) by spin coating at 4,000 rpm for 15 s and annealed at 120° C. for 120 s. A resist layer with a thickness of around 70 nm was spin-coated on the substrates at 4,000 rpm for 30 s from a ZEP520A-7 solution (ZEON Co.) and baked at 180° C. for 240 s. Electron beam lithography was performed to draw grating patterns on the resist layer using a JBX-5500SC system (JEOL) with an optimized dose of 0.1 nC cm$^{-2}$. After the electron beam irradiation, the patterns were developed in a developer solution (ZED-N50, ZEON Co.) at room temperature. The patterned resist layer was used as an etching mask while the substrate was plasma etched with CHF$_3$ using an EIS-200ERT etching system (ELIONIX). To completely remove the resist layer from the substrate, the substrate was plasma-etched with O$_2$ using a FA-1EA etching system (SAMCO). The etching conditions were optimized to completely remove the SiO$_2$ from the grooves in the DFB until the ITO was exposed. The gratings formed on the SiO$_2$ surfaces were observed with SEM (SU8000, Hitachi) (FIG. 1c). EDX (at 6.0 kV, SU8000, Hitachi) analysis was performed to confirm complete removal of SiO$_2$ from ditches in the DFB (FIG. 2c, d). Cross section SEM and EDX were measured by Kobelco using a cold-field-emission SEM (SU8200, Hitachi High-Technologies), an energy dispersive X-ray spectrometry (XFlash FladQuad5060, Bruker), and a focused ion beam system (FB-2100, Hitachi High-Technologies) (FIG. 1d, e).

The DFB substrates were cleaned by conventional ultrasonication. Organic layers and a metal electrode were then vacuum-deposited by thermal evaporation under a pressure of 1.5×10$^{-4}$ Pa with a total evaporation rate of 0.1-0.2 nm s$^{-1}$ on the substrates to fabricate OSLDs with the structure indium tin oxide (ITO) (100 nm)/20 wt % BSBCz:Cs (60 nm)/BSBCz (150 nm)/MoO$_3$ (10 nm)/Ag (10 nm)/Al (90 nm). The SiO$_2$ layers on the ITO surface acted as insulators in addition to a DFB grating. Therefore, the current flow regions of the OLEDs were limited to the DFB regions where BSBCz is in direct contact with ITO. Reference OLEDs with an active area of 30×45 µm were also prepared with same current flow region.

(Device Characterization)

All the devices were encapsulated in a nitrogen-filled glove box using glass lids and UV-cured epoxy to prevent any degradation resulting from moisture and oxygen. Current density-voltage-$\eta_{EQE}$ (J-V-$\eta_{EQE}$) characteristics (DC) of the OSLDs and OLEDs were measured using an integrating sphere system (A10094, Hamamatsu Photonics) at room temperature. For pulse measurements, rectangular pulses with a pulse width of 400 ns, pulse period of 1 ms, repetition frequency of 1 kHz, and varying peak currents were applied to the devices at ambient temperature using a pulse generator (NF, WF1945). Using these conditions, the inventors could apply to a properly working OSLD from a good batch roughly 50 pulse at 1 kA cm$^{-2}$ (near threshold), 20 pulses at 2 kA cm$^{-2}$, and 10 pulse at 3 kA cm$^{-2}$ before electrical breakdown. Approximately 500 devices were fabricated in this work with a yield of about 5%. The J-V-luminance characteristics under pulse driving were measured with an amplifier (NF, HSA4101) and a photomultiplier tube (PMT) (C9525-02, Hamamatsu Photonics). Both the PMT response and the driving square wave signal were monitored on a multi-channel oscilloscope (Agilent Technologies, MSO6104A). The $\eta_{EQE}$ was calculated by dividing the number of photons, which was calculated from the PMT-response EL intensity with a correction factor, by the number of injected electrons, which was calculated from the current. Output power was measured using a laser power meter (OPHIR Optronics Solution Ltd., StarLite 7Z01565).

To measure the spectra, emitted laser light for both optically and electrically pumped OSLDs was collected normal to the device surface with an optical fiber connected to a multichannel spectrometer (PMA-50, Hamamatsu Photonics) and placed 3 cm away from the device. The beam profile of the OSLDs was checked by using a CCD camera (beam profiler WimCamD-LCM, DataRay). For characteristics of OSLD-6 and OSL under optical pumping, pulsed excitation light from a nitrogen-gas laser (NL100, N$_2$ laser, Stanford Research System) was focused in a 6×10$^{-3}$ cm$^2$ area of the device through a lens and slit. The excitation wavelength was 337 nm, pulse width was 3 ns, and repetition rate was 20 Hz. The excitation light was incident upon the devices at around 20° with respect to the normal to the device plane. Excitation intensities were controlled using a set of neutral density filters. Steady-state PL spectroscopy was monitored using a spectrofluorometer (FP-6500, JASCO) in FIG. 10 and a spectrometer (PMA-50) in FIG. 6. Near-field patterns of an OSL and an OSLD-6 were taken using a laser beam profiler (C9334-01, Hamamatsu Photonics) with near-field optics (A4859-06, Hamamatsu Photonics), and far-field patterns of an OSL were taken with the same profiler and near-field optics (A3267-11, Hamamatsu Photonics).

The lower limit for the electrical lasing threshold was determined from the optical threshold using the equation $$J = 2\frac{P_{th}\lambda/hc\eta_{out}\varphi_{PL}e}{\eta_{EQE}},$$

where $P_{th}$, $\lambda$, h, c, $\eta_{out}$, $\varphi_{PL}$, $\eta_{EQE}$, and e are the optical pumping threshold and wavelength, Planck constant, speed of light, device outcoupling efficiency, photoluminescence quantum yield of BSBCz, external quantum efficiency of a BSBCz OSLD, and elementary charge, respectively. This equation simply solves for the current density at which the rate of singlets generated under electrical excitation should be equal to that under an optical excitation of $P_{th}$. This equation does not account for additional loss mechanisms that occur under electrical excitation at high current densities. The inventors used an $\eta_{out}$ of 20% and $\varphi_{PL}$ of 76% (from Table 2). Iterating over several values in FIG. 3d to get good agreement between $\eta_{EQE}$ and J, the inventors settled on a final $\eta_{EQE}$ of 2.1%. The factor of two is to account for the fact that the inventors used only the exposed ITO area, which is half of the total grating area, when calculating current densities for OSLDs in this paper.

(Device Modeling and Parameters)

The optical simulation of the resonant DFB cavity was performed using Comsol Multiphysics 5.2a software. The Helmholtz equation was solved for every frequency using the Finite Element Method (FEM) in the Radio Frequency module of Comsol software. Each layer was represented by its complex refractive index and thickness. The computation domain was limited to one supercell composed of a second-order grating surrounded by first-order gratings. The Floquet periodic boundary conditions were applied for lateral boundaries, and scattering boundary conditions were used for the top and bottom domains. Only TE modes were considered since TM modes are suppressed because they experience more losses than the TE modes (due to metal absorption).

The charge transport through the OSLD was described using the two-dimensional time-independent drift-diffusion equation coupled to the Poisson equation and the continuity equation for charge carriers using the Technology Computer Aided Design (TCAD) software from Silvaco. The electron and hole concentrations were expressed using parabolic density of states (DOS) and Maxwell-Boltzmann statistics. A Gaussian distribution was used to model the trap distribution within the organic semiconductor[37]. The charge carrier mobilities were assumed to be field dependent and have a Pool-Frenkel form[38,39]. In this model the energetic disorder was not taken into account, so the inventors assumed the validity of Einstein's relation to calculate the charge carrier diffusion constant from the charge carrier mobility. The recombination rate R was given by the Langevin model[40]. The continuity equation for singlet excitons is solved by taking into account the exciton diffusion, the radiative and non-radiative processes.

Experimental data for hole-only and electron-only devices (energy diagrams and structures in FIG. 4) were fitted to extract the charge carrier mobilities. The values of the fitted mobility parameters and other input parameters used in the simulations are presented in Table 2. The extracted values were used to simulate bipolar OLED devices with the structure ITO/20 wt % Cs:BSBCz (10 nm)/BSBCz (190 nm)/MoO$_3$ (10 nm)/Al. The work function of the cathode (ITO/20 wt % Cs:BSBCz) was taken to be 2.6 eV and that of the anode (MoO$_3$/Al) 5.7 eV. The influence of the DFB grating on the electrical properties of the OSLD were calculated and compared to the reference device (without grating). The modal gain $g_m$ was calculated from $S(x, y)$ and the optical mode intensity $|E(x, y)|^2$ using the equation $$g_m = \frac{\sigma_{stim} \int_0^L \int_0^d |E(x, y)|^2 S(x, y) dy dx}{\int_0^L \int_0^d |E(x, y)|^2 dy dx},$$

where L is cavity length (only the second-order grating region) and d is the active film thickness.

Near- and far-field patterns were simulated using the OptiFDTD software package (Optiwave). Near-field patterns were simulated using the FDTD method. From these patterns, the Fraunhofer approximation was used to calculate the far-field pattern. Perfect matched layer and periodic conditions were used as the boundary conditions.

TABLE 2

| Parameters for optical and electrical simulations. | | | |
|---|---|---|---|
| Parameter | BSBCz | BSBCz:Cs | Units |
| $\epsilon_r$ | 4 | 4 | — |
| $E_{HOMO}$ | 5.8 | 5.8 | eV |
| $E_{LUMO}$ | 3.1 | 3.1 | eV |
| $N_{HOMO}$ | $2 \times 10^{-19}$ | $2 \times 10^{-19}$ | cm$^{-3}$ |
| $N_{LUMO}$ | $2 \times 10^{-19}$ | $2 \times 10^{-19}$ | cm$^{-3}$ |
| $N_{tp}$ | $2.8 \times 10^{-17}$ | — | cm$^{-3}$ |
| $E_{tp}$ | 0.375 | — | eV |
| $\sigma_{tp}$ | 0.017 | — | eV |
| $\mu_{n0}$ | $6.55 \times 10^{-5}$ | $6.55 \times 10^{-5}$ | cm$^2$ V$^{-1}$ s$^{-1}$ |
| $\mu_{p0}$ | $1.9 \times 10^{-4}$ | $1.9 \times 10^{-4}$ | cm$^2$ V$^{-1}$ s$^{-1}$ |
| $F_{n0}$ | 175,561 | 175,561 | V cm$^{-1}$ |
| $F_{p0}$ | 283,024 | 283,024 | V cm$^{-1}$ |
| $k_r$ | $0.6 \times 10^9$ | $0.6 \times 10^9$ | s$^{-1}$ |
| $k_{nr}$ | $0.18 \times 10^9$ | $0.89 \times 10^9$ | s$^{-1}$ |

TABLE 2-continued

| Parameters for optical and electrical simulations. | | | |
|---|---|---|---|
| Parameter | BSBCz | BSBCz:Cs | Units |
| $\varphi_{PL}$ | 0.76 | 0.4 | — |
| $L_S$ | 18 | 18 | nm |

$\epsilon_r$ is the relative permittivity of the material. $E_{HOMO}$ and $E_{LUMO}$ are the energy levels of the highest occupied molecular orbital (HOMO) and the lowest unoccupied molecular orbital (LUMO), respectively. $N_{HOMO}$ and $N_{LUMO}$ are the densities of states of the HOMO and the LUMO levels. $N_{tp}$ is the total density of trap, $E_{tp}$ is the energy depth of traps above the HOMO level and $\sigma_{tp}$ is the width of the Gaussian distribution. $\mu_{n0}$ and $\mu_{p0}$ are the zero-field mobility. $F_{n0}$ and $F_{p0}$ are the characteristic electric field for electron and hole, respectively. $k_r$ is the radiative decay constant and $k_{nr}$ is the non-radiative decay constant. $\varphi_{PL}$ is the photoluminescence quantum yield. $L_S$ is the exciton diffusion length. As an approximation, the mobilities of BSBCz:Cs were set to be the same as those of BSBCz, which resulted in good fits to experimental data, so the mobilities were not further refined.

The invention claimed is:

1. A current-injection organic semiconductor laser diode comprising:
    a substrate composed of a first electrode and an optical resonator structure of an insulating material,
    one or more organic layers including a light amplification layer composed of an organic semiconductor, and
    a second electrode,
    which has a sufficient overlap between a distribution of exciton density and an electric field intensity distribution of a resonant optical mode during current injection to emit laser light,
    wherein the organic layers are laminated on the surface of the substrate.

2. The current-injection organic semiconductor laser diode according to claim 1, wherein the optical resonator structure has a distributed feedback (DFB) structure.

3. The current-injection organic semiconductor laser diode according to claim 2, wherein the optical resonator structure is composed of a second-order Bragg scattering region surrounded by a first-order Bragg scattering region.

4. The current-injection organic semiconductor laser diode according to claim 2, wherein a second-order Bragg scattering region and a first-order Bragg scattering region are formed alternately in the optical resonator structure.

5. The current-injection organic semiconductor laser diode according to claim 1, wherein the number of the one or more organic layers is 2 or less.

6. The current-injection organic semiconductor laser diode according to claim 1, wherein the thickness of the light amplification layer relative to the total thickness of the one or more organic layers is more than 50%.

7. The current-injection organic semiconductor laser diode according to claim 1, wherein the organic semiconductor contained in the light amplification layer is amorphous.

8. The current-injection organic semiconductor laser diode according to claim 1, wherein the molecular weight of the organic semiconductor contained in the light amplification layer is 1000 or less.

9. The current-injection organic semiconductor laser diode according to claim 1, wherein the organic semiconductor contained in the light amplification layer is a nonpolymer.

10. The current-injection organic semiconductor laser diode according to claim 1, wherein the organic semiconductor contained in the light amplification layer has at least one stilbene unit.

11. The current-injection organic semiconductor laser diode according to claim 1, wherein the organic semiconductor contained in the light amplification layer has at least one carbazole unit.

12. The current-injection organic semiconductor laser diode according to claim 1, wherein the organic semiconductor contained in the light amplification layer is 4,4'-bis[(N-carbazole)styryl]biphenyl (BSBCz).

13. The current-injection organic semiconductor laser diode according to claim 1, which has an electron injection layer as one of the organic layers.

14. The current-injection organic semiconductor laser diode according to claim 13, wherein the electron injection layer contains Cs.

15. The current-injection organic semiconductor laser diode according to claim 1, which has a hole injection layer as an inorganic layer.

16. The current-injection organic semiconductor laser diode according to claim 15, wherein the hole injection layer contains molybdenum oxide.

17. The current-injection organic semiconductor laser diode according to claim 1, wherein the first electrode is transparent.

18. The current-injection organic semiconductor laser diode according to claim 1, wherein the first electrode is ITO.

19. The current-injection organic semiconductor laser diode according to claim 1, wherein the light amplification layer contacts with the first electrode.

* * * * *